(12) United States Patent
Choi et al.

(10) Patent No.: US 11,837,475 B2
(45) Date of Patent: Dec. 5, 2023

(54) SEMICONDUCTOR DEVICE INCLUDING CONDUCTIVE LINE AND METHOD FOR MANUFACTURING THE SAME

(71) Applicant: Samsung Electronics Co., Ltd., Suwon-si (KR)

(72) Inventors: Jaemyung Choi, Busan-si (KR); Kyoungwoo Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 321 days.

(21) Appl. No.: 17/395,030

(22) Filed: Aug. 5, 2021

(65) Prior Publication Data
US 2022/0270890 A1 Aug. 25, 2022

(30) Foreign Application Priority Data
Feb. 19, 2021 (KR) .......................... 10-2021-0022455

(51) Int. Cl.
*H01L 21/3213* (2006.01)
*H01L 21/027* (2006.01)

(52) U.S. Cl.
CPC .... *H01L 21/32139* (2013.01); *H01L 21/0273* (2013.01)

(58) Field of Classification Search
CPC ........... H01L 21/32139; H01L 21/0273; H01L 27/092; H01L 23/5283; H01L 21/76816; H01L 21/31144; H01L 21/76807
See application file for complete search history.

(56) References Cited

U.S. PATENT DOCUMENTS

| | | | |
|---|---|---|---|
| 8,053,346 B2 | 11/2011 | Ryu et al. | |
| 8,117,582 B2 | 2/2012 | Lee | |
| 8,679,729 B2 | 3/2014 | Lee | |
| 10,347,506 B2 | 7/2019 | Fan et al. | |
| 10,558,781 B2 | 2/2020 | Sato | |
| 10,747,937 B2 | 8/2020 | Park | |
| 2002/0164870 A1* | 11/2002 | Cowley | H01L 21/76802 438/633 |
| 2016/0370699 A1 | 12/2016 | Chen et al. | |
| 2018/0096840 A1* | 4/2018 | Jeong | G03F 7/0752 |
| 2018/0233583 A1* | 8/2018 | Schepis | H01L 29/42392 |
| 2021/0358751 A1* | 11/2021 | Gao | H01L 21/0276 |

FOREIGN PATENT DOCUMENTS

KR    10-2018-0018571 A    2/2018

* cited by examiner

*Primary Examiner* — Douglas W Owens
(74) *Attorney, Agent, or Firm* — Harness, Dickey & Pierce, P.L.C.

(57) ABSTRACT

A method for manufacturing a semiconductor device including forming an insulating structure, forming a hard mask layer on the insulating structure, performing a first etching process to form a first opening at the hard mask layer, forming a first sacrificial pattern in the first opening, forming, on the hard mask layer, a first photoresist pattern including a second opening and a third opening, the second opening exposing a top surface of the first sacrificial pattern, the third opening exposing a top surface of the hard mask layer, and performing a second etching process using the first photoresist pattern as an etch mask may be provided.

20 Claims, 35 Drawing Sheets

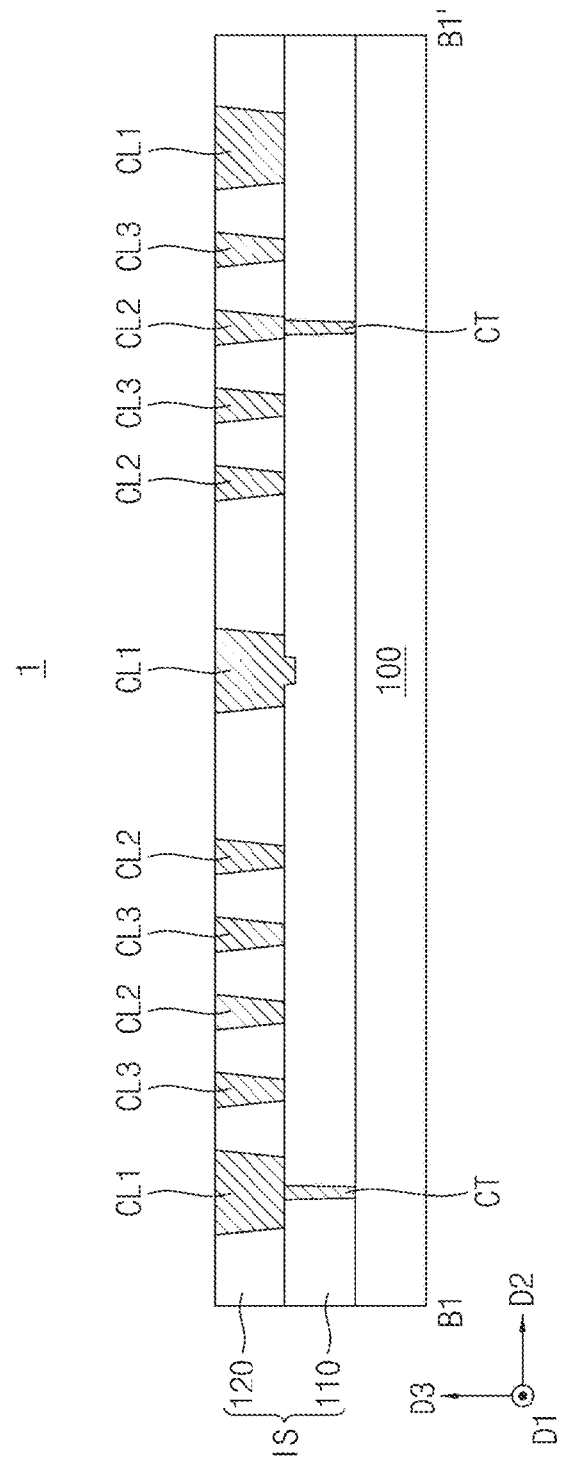

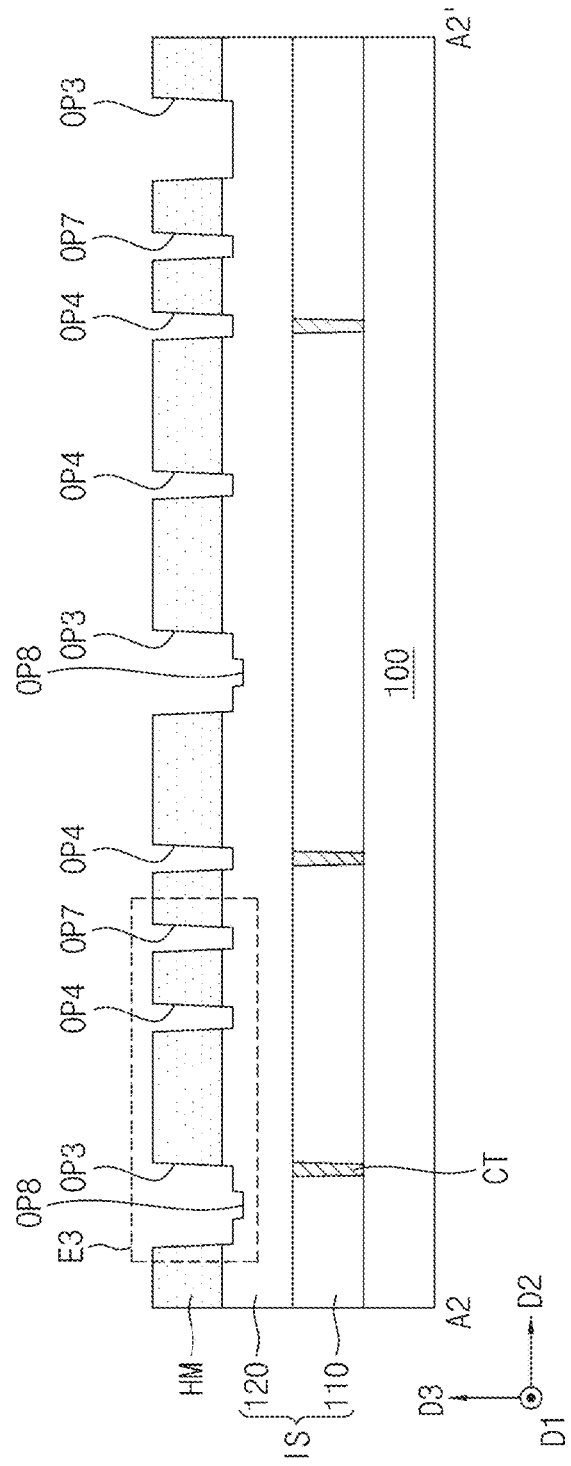

SEMICONDUCTOR DEVICE INCLUDING CONDUCTIVE LINE AND METHOD FOR MANUFACTURING THE SAME

CROSS-REFERENCE TO THE RELATED APPLICATION

This application claims priority under 35 U.S.C. § 119 to Korean Patent Application No. 10-2021-0022455, filed on Feb. 19, 2021, in the Korean Intellectual Property Office, the disclosure of which is incorporated herein by reference in its entirety.

BACKGROUND

1. Field

Some example embodiments of the disclosure relate to semiconductor devices and/or methods for manufacturing the same. In particular, some example embodiments of the disclosure relate to semiconductor devices including a plurality of conductive lines and/or methods for manufacturing the same.

2. Description of the Related Art

Semiconductor devices are being highlighted in the electronics industry in accordance with characteristics thereof such as miniaturization, multi-functionalization and/or low manufacturing costs. Semiconductor devices may be classified into a semiconductor memory device to store logic data, a semiconductor logic device to arithmetically process logic data, and a hybrid semiconductor device including a memory element and a logic element. In accordance with rapid advances in electronics industries, demand for characteristics of semiconductor devices is gradually increasing. For example, demands for high reliability, high speed and/or multi-functionalization of semiconductor devices are gradually increasing. In order to satisfy such demanded characteristics, structures in semiconductor devices become more and more complicated. In addition, semiconductor devices become more and more highly integrated.

SUMMARY

Some example embodiments of the disclosure provide semiconductor devices having enhanced reliability.

A method for manufacturing a semiconductor device in accordance with some example embodiments of the disclosure may include forming an insulating structure, forming a hard mask layer on the insulating structure, performing a first etching process to form a first opening at the hard mask layer, forming a first sacrificial pattern in the first opening, forming, on the hard mask layer, a first photoresist pattern including a second opening and a third opening, and performing a second etching process using the first photoresist pattern as an etch mask. The second opening may expose a top surface of the first sacrificial pattern. The third opening may expose a top surface of the hard mask layer.

A method for manufacturing a semiconductor device in accordance with some example embodiments of the disclosure may include forming an insulating structure, forming a hard mask layer on the insulating structure, performing a first etching process to form a first opening and a second opening at the hard mask layer, forming a first sacrificial pattern in the first opening, and forming a second sacrificial pattern in the second opening, forming, on the hard mask layer, a first photoresist pattern including a third opening, and performing a second etching process using the first photoresist pattern as an etch mask. The third opening may expose a top surface of the first sacrificial pattern. The first photoresist pattern may cover the second sacrificial pattern.

A method for manufacturing a semiconductor device in accordance with some example embodiments of the disclosure may include performing a first etching process to form first openings and second openings at a hard mask layer, forming first sacrificial patterns in the first openings, and forming second sacrificial patterns in the second openings, forming, on the hard mask layer, a first photoresist pattern including third openings and fourth openings, and performing a second etching process using the first photoresist pattern as an etch mask. The third openings may expose top surfaces of the first sacrificial patterns, respectively. The fourth openings may expose a top surface of the hard mask layer. The second sacrificial patterns may be covered by the first photoresist pattern. The performing a second etching process may include etching the first sacrificial patterns through the third openings, and etching the hard mask layer through the fourth openings.

BRIEF DESCRIPTION OF THE DRAWINGS

FIG. 1C is a cross-sectional view taken along line B1-B1' in FIG. 1A.

FIGS. 3B, 4B, 5B, 6B, 7B and 8B are cross-sectional views taken along line A2-A2' in FIGS. 3A, 4A, 5A, 6A, 7A and 8A, respectively.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
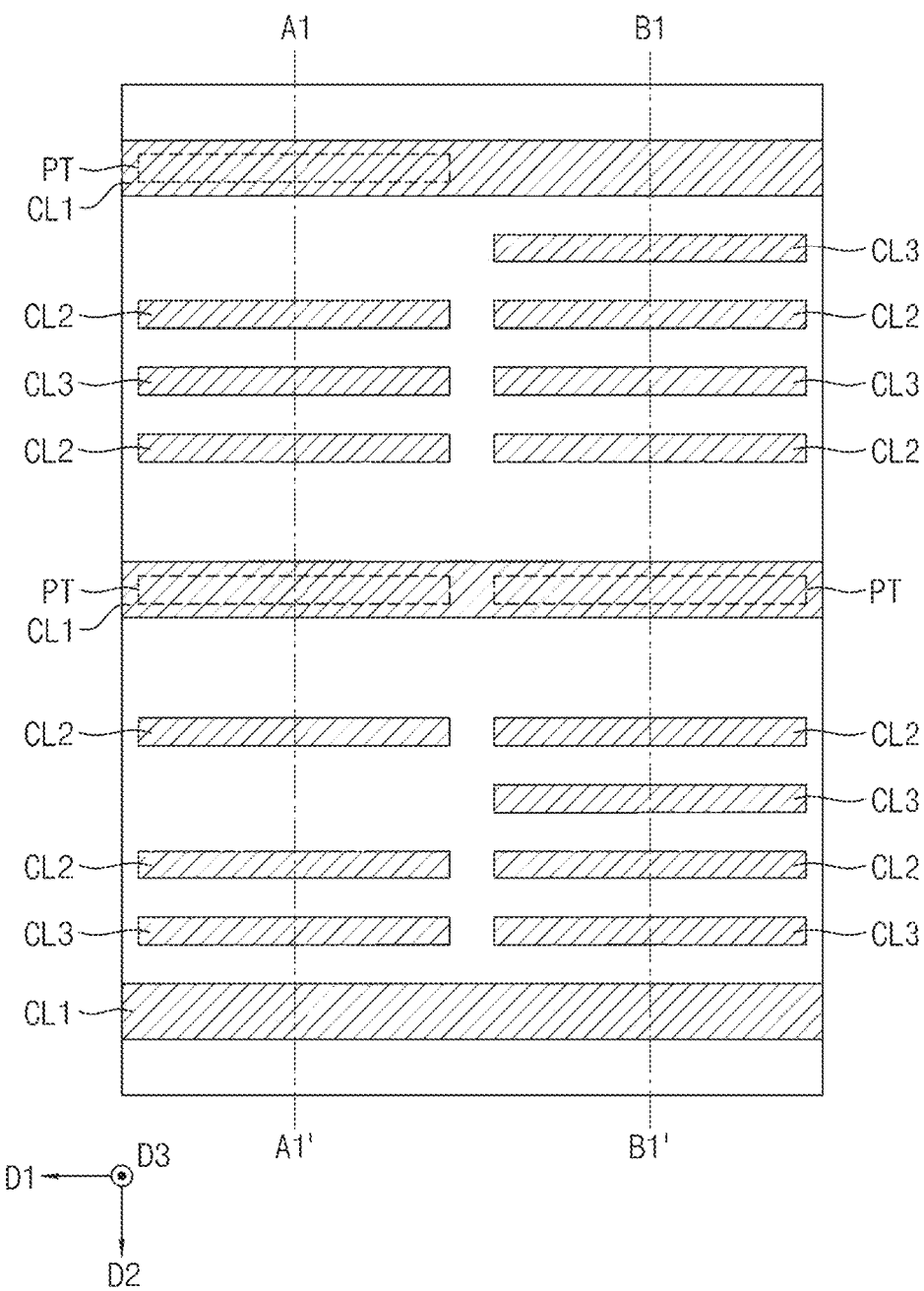
FIG. 1A is a plan view of a semiconductor device according to some example embodiments of the disclosure.
Figure 1B:
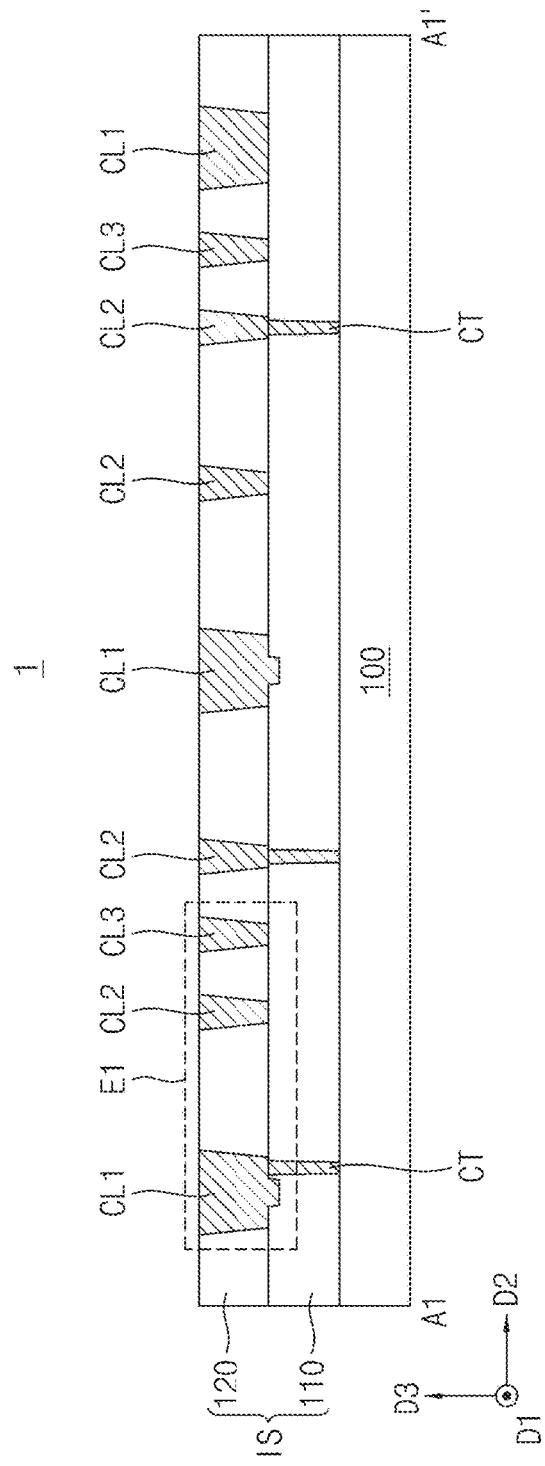
FIG. 1B is a cross-sectional view taken along line A1-A1' in FIG. 1A.
Figure 1D:
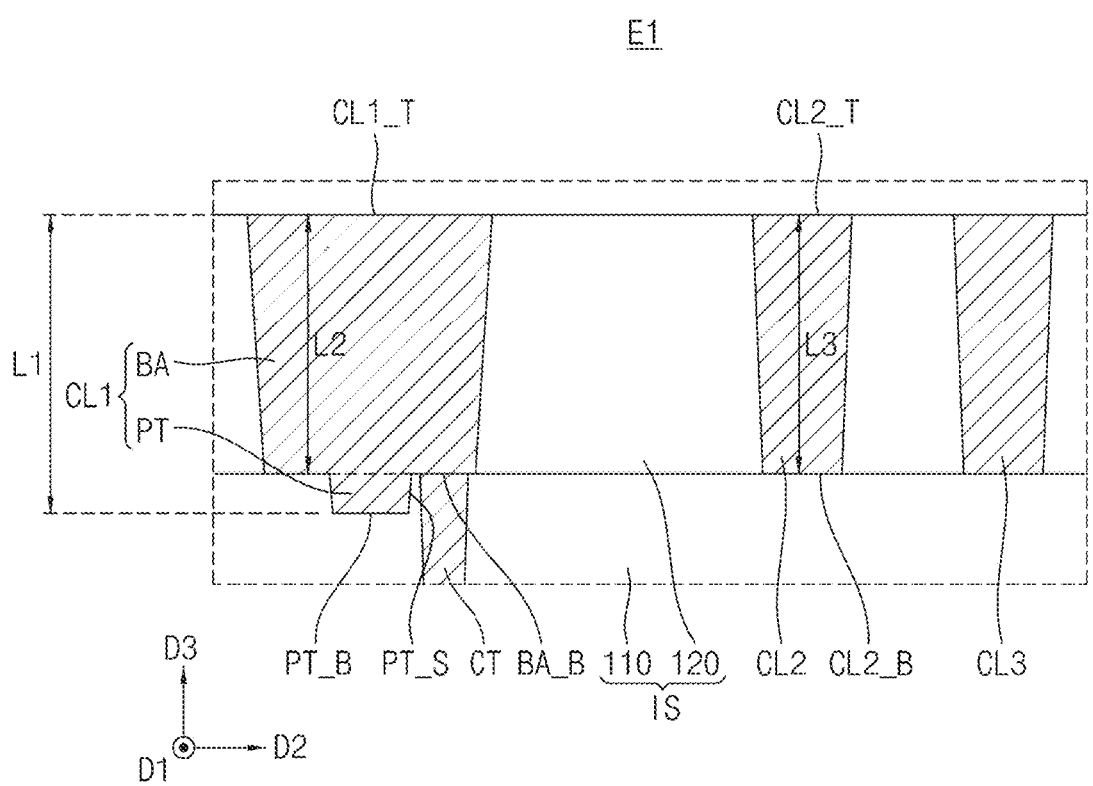
FIG. 1D is an enlarged view of a portion E1 of FIG. 1B.

FIG. 1A is a plan view of a semiconductor device according to some example embodiments of the disclosure. FIG. 1B is a cross-sectional view taken along line A1-A1' in FIG. 1A. FIG. 1C is a cross-sectional view taken along line B1-B1' in FIG. 1A. FIG. 1D is an enlarged view of a portion E1 of FIG. 1B.

Referring to FIGS. 1A, 1B and 1C, a semiconductor device 1 may include a substrate 100, and an insulating structure IS on the substrate 100. The substrate 100 may have the form of a plate extending along a plane defined by a first direction D1 and a second direction D2. The first direction D1 and the second direction D2 may intersect each other. For example, the first direction D1 and the second direction D2 may perpendicularly intersect each other. In some example embodiments, the substrate 100 may be a semiconductor substrate. For example, the substrate 100 may include silicon, germanium, silicon-germanium, GaP, or GaAs. In some embodiments, the substrate 100 may be a silicon-on-insulator (SOI) substrate or a germanium-on-insulator (GOI) substrate.

The insulating structure IS may include a first insulating layer 110, and a second insulating layer 120 on the first insulating layer 110. The first insulating layer 110 may cover a top surface of the substrate 100. The first insulating layer 110 may include an insulating material. For example, the first insulating layer 110 may include an oxide.

The second insulating layer 120 may cover a top surface of the first insulating layer 110. The second insulating layer 120 may include an insulating material. For example, the second insulating layer 120 may include an oxide.

In some example embodiments, a logic element may be provided between the substrate 100 and the first insulating layer 110. In some example embodiments, a memory element may be provided between the substrate 100 and the first insulating layer 110. For example, the memory element may be a volatile memory element (e.g., a dynamic random access memory (DRAM)) or a non-volatile memory element (e.g., a flash memory, a magnetic RAM (MRAM), a ferroelectric RAM (FRAM), a phase change RAM (PRAM), or a resistive RAM (RRAM)).

Contacts CT extending through the first insulating layer 110 of the insulating structure IS may be provided. The first insulating layer 110 of the insulating structure IS may surround each contact CT. The contact CT may be electrically connected to the logic element or the memory element provided between the substrate 100 and the first insulating layer 110. The contact CT may extend in a third direction D3. The third direction D3 may intersect the first direction D1 and the second direction D2. For example, the third direction D3 may perpendicularly intersect the first direction D1 and the second direction D2.

First conductive lines CL1, second conductive lines CL2 and third conductive lines CL3 extending through the second insulating layer 120 of the insulating structure IS may be provided. The first to third conductive lines CL1, CL2 and CL3 may extend in the first direction D1. The first to third conductive lines CL1, CL2 and CL3 may be spaced apart from one another. The first to third conductive lines CL1, CL2 and CL3 may be disposed at the same level.

The first conductive lines CL1 may be spaced apart from one another in the second direction D2. A plurality of second conductive lines CL2 and a plurality of third conductive lines CL3 may be disposed between adjacent ones of the first conductive lines CL1. For example, the second conductive lines CL2 and the third conductive lines CL3 may constitute two conductive line columns between the adjacent first conductive lines CL1. The second conductive line CL2 and the third conductive line CL3 included in each conductive line column may be arranged to be spaced apart from each other in the second direction D2. The conductive line columns may be spaced apart from each other in the first direction D1. The number and arrangement of the second conductive lines CL2 and the third conductive lines CL3 between the adjacent first conductive lines CL1 are not limited to the shown case.

Each of the first to third conductive lines CL1, CL2 and CL3 may be electrically connected to the logic element or the memory element provided between the substrate 100 and the first insulating layer 110 via the contact CT. Each of the first to third conductive lines CL1, CL2 and CL3 may contact the contact CT.

Referring to FIGS. 1A and 1D, at least one of the first conductive lines CL1 may include a base BA and a protrusion PT. The base BA may be disposed in the second insulating layer 120 of the insulating structure IS. The base BA may be surrounded by the second insulating layer 120 of the insulating structure IS. The protrusion PT may be disposed in the first insulating layer 110 of the insulating structure IS. The protrusion PT may be surrounded by the first insulating layer 110 of the insulating structure IS. The base BA may be disposed on the protrusion PT. The protrusion PT may be disposed under the base BA. The protrusion PT may overlap the base BA in the third direction D3. For example, the protrusion PT may vertically overlap the base BA. The protrusion PT may protrude from a bottom surface BA_B of the base BA in a direction opposite to the third direction D3. The first conductive lines CL1 may include a first conductive line CL1 including a plurality of protrusions PT.

The level of the bottom surface BA_B of the base BA may be higher than the level of a bottom surface PT_B of the protrusion PT. The bottom surface BA_B of the base BA and the bottom surface PT_B of the protrusion PT may be connected to each other by a side wall PT_S of the protrusion PT. The minimum distance from the bottom surface PT_B of the protrusion PT to a top surface CL1_T of the first conductive line CL1 may be defined as a first distance L1. The first distance L1 may be a distance from the bottom surface PT_B of the protrusion PT to the top surface CL1_T of the first conductive line CL1 in the third direction D3. The minimum distance from the bottom surface BA_B of the base BA to the top surface CL1_T of the first conductive line CL1 may be defined as a second distance L2. The second distance L2 may be a distance from the bottom surface BA_B of the base BA to the top surface CL1_T of the first conductive line CL1 in the third direction D3. The first distance L1 may be greater than the second distance L2.

The minimum distance from a bottom surface CL_2B of the second conductive line CL2 to a top surface CL2_T of the second conductive line CL2 may be defined as a third distance L3. The third distance L3 may be a distance from the bottom surface CL_2B of the second conductive line CL2 to the top surface CL2_T of the second conductive line CL2 in the third direction D3. The third distance L3 may be equal to the second distance L2. The third distance L3 may be smaller than the first distance L1. The minimum distance from a bottom surface of the third conductive line CL3 to a top surface of the third conductive line CL3 may be equal to the second and third distances L2 and L3 while being smaller than the first distance L1. The levels of the bottom surfaces of the second and third conductive lines CL2 and CL3 may be equal to the level of the bottom surface BA_B of the base BA, and may be higher than the level of the bottom surface PT_B of the protrusion PT.

The minimum width of the base BA may be greater than the maximum width of the protrusion PT. For example, the minimum width of the base BA in the second direction D2 may be greater than the maximum width of the protrusion PT in the second direction D2. The minimum width of the base BA may be greater than the maximum width of the third conductive line CL3. For example, the minimum width of the base BA in the second direction D2 may be greater than the maximum width of the third conductive line CL3 in the second direction D2. The protrusion PT may be disposed at the same level as an upper portion of the contact CT. The base BA may be disposed at a higher level than the contact CT.

Figure 2:
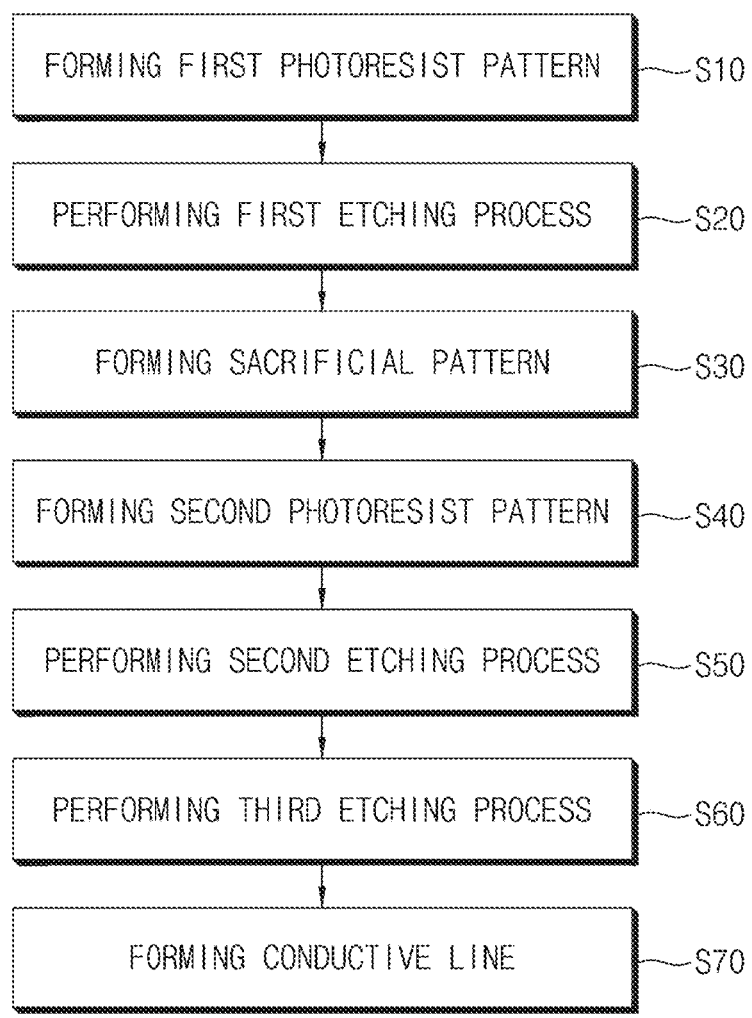
FIG. 2 is a flowchart explaining a method for manufacturing a semiconductor device in accordance with some example embodiments of the disclosure.
Figure 6A:
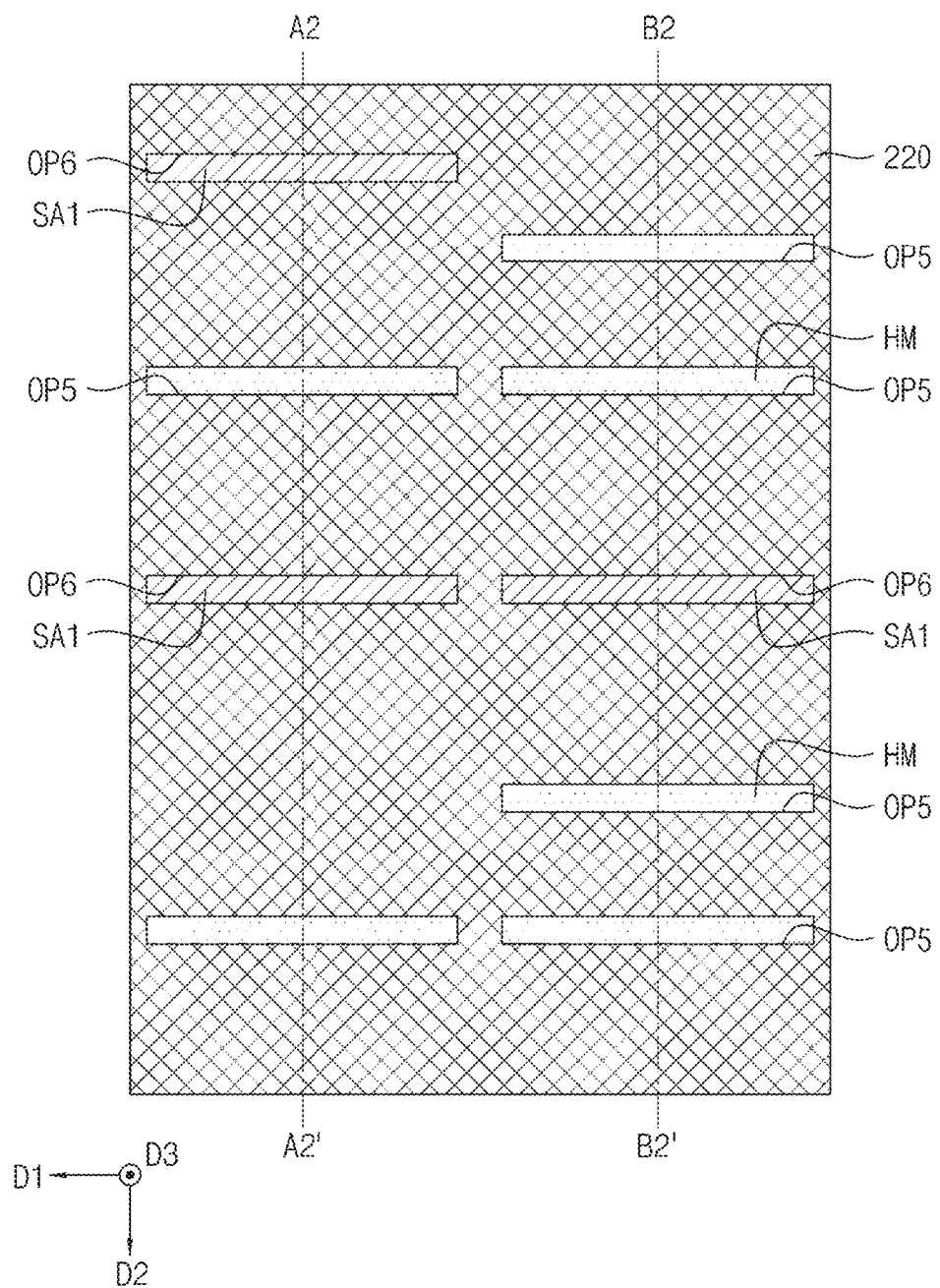
Figure 6B:
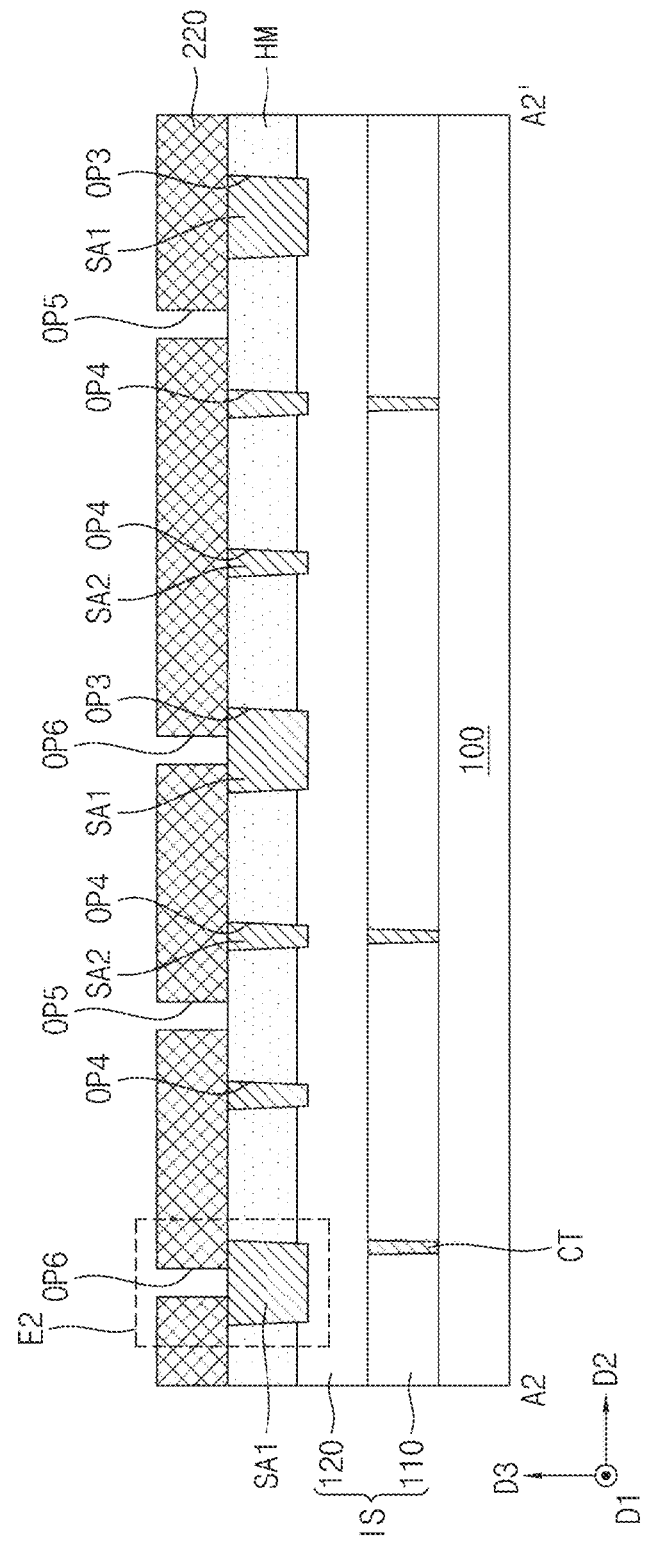
Figure 6C:
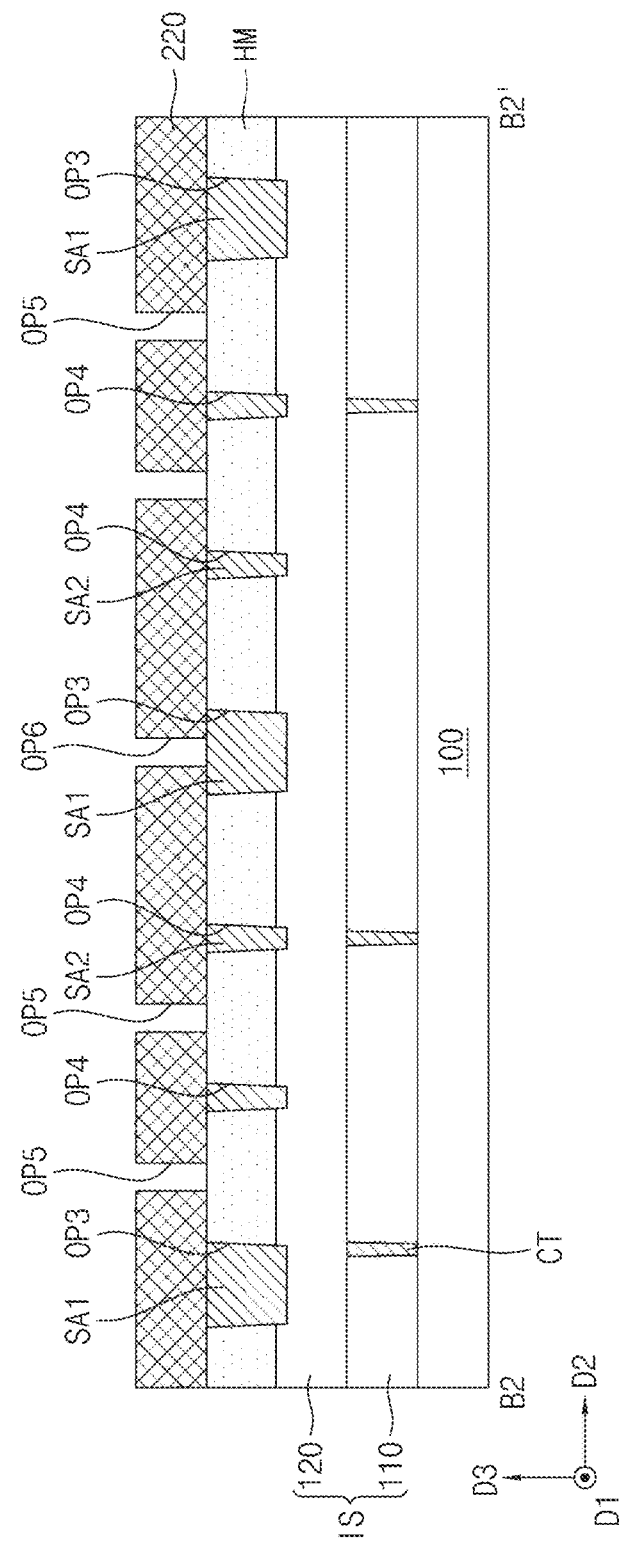
FIGS. 6C, 7C and 8C are cross-sectional views taken along line B2-B2' in FIGS. 6A, 7A and 8A, respectively.
Figure 6D:
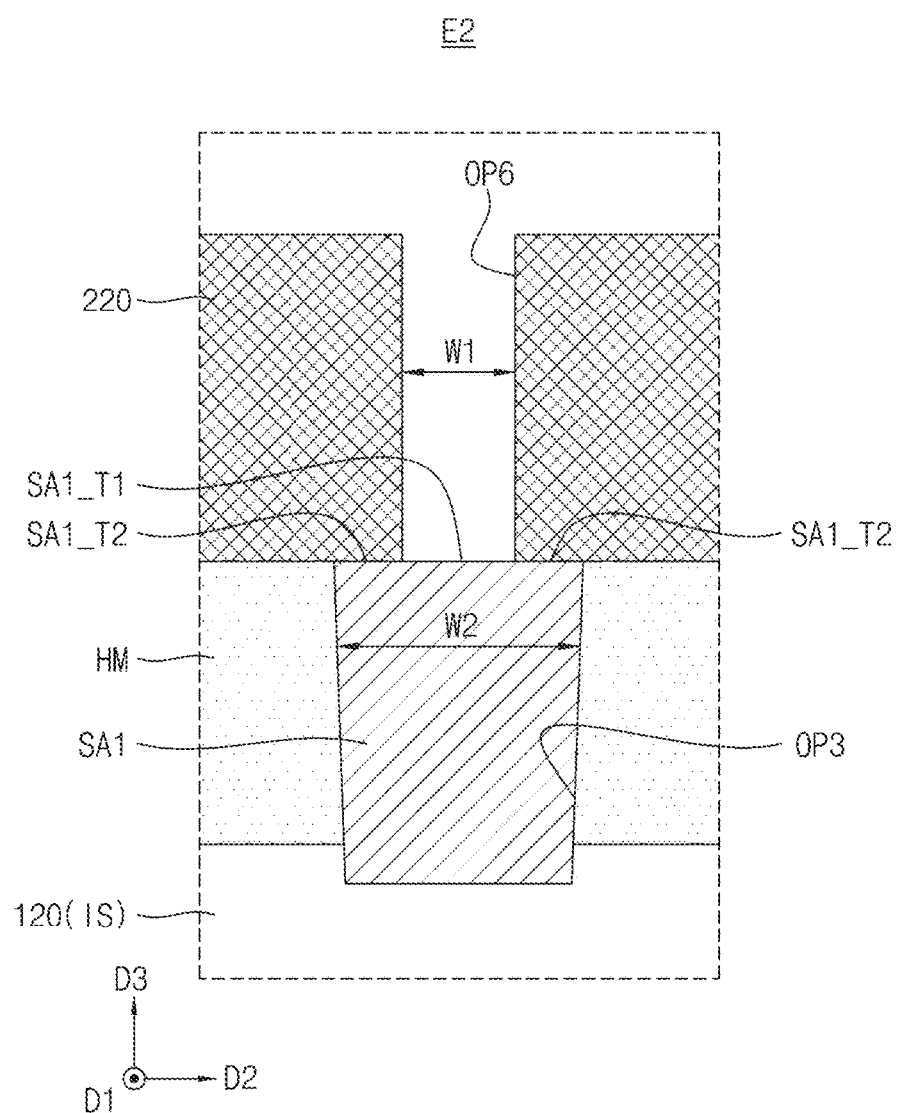
FIG. 6D is an enlarged view of a portion E2 of FIG. 6B.
Figure 7A:
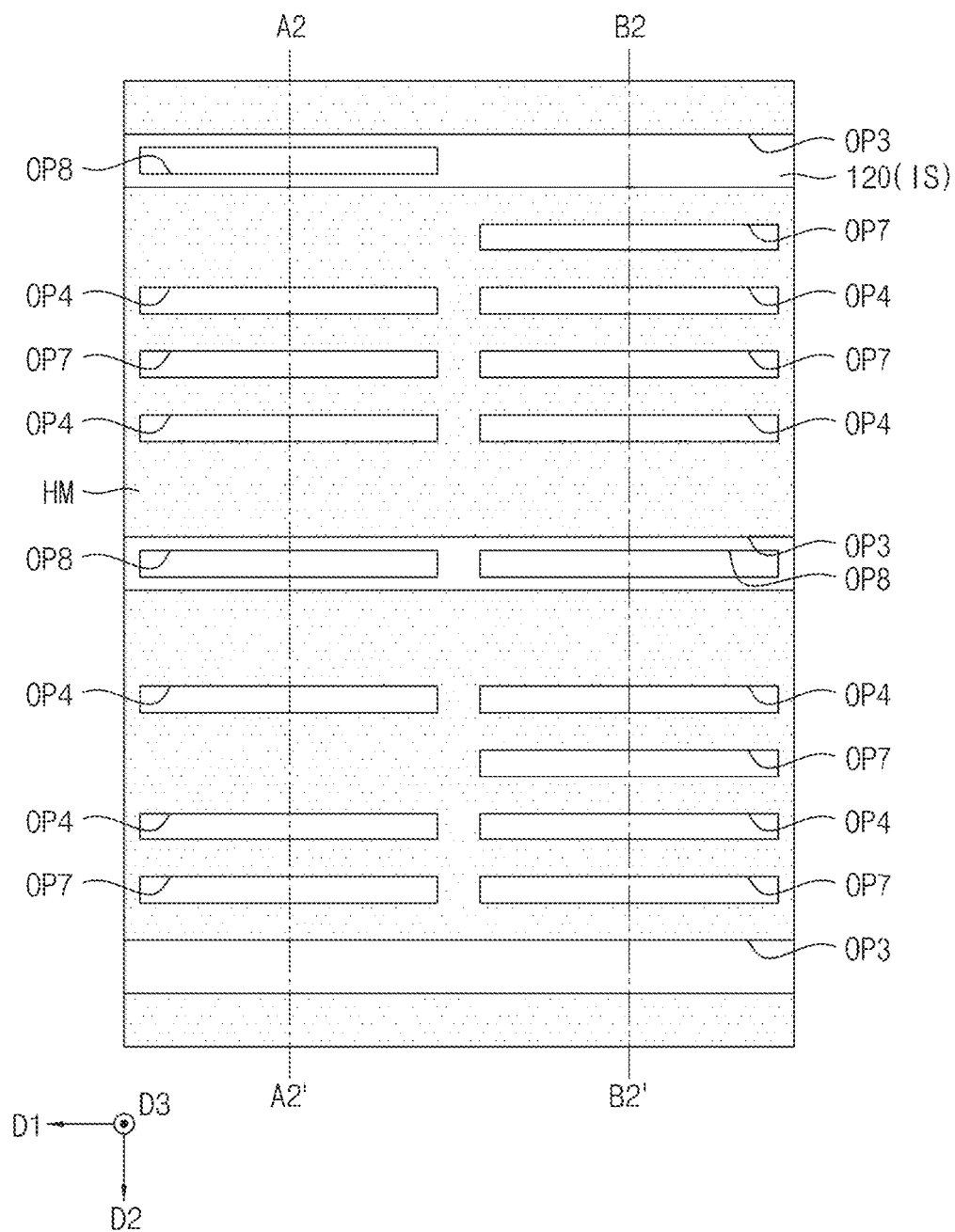
Figure 7C:
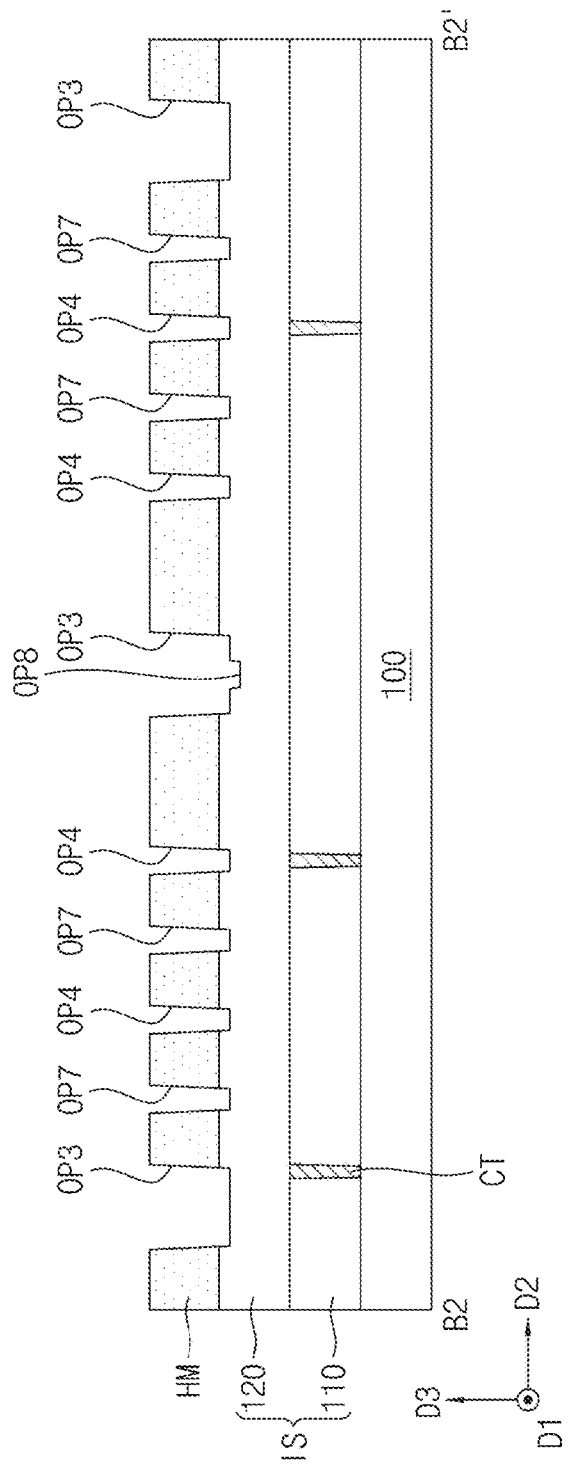
Figure 7D:
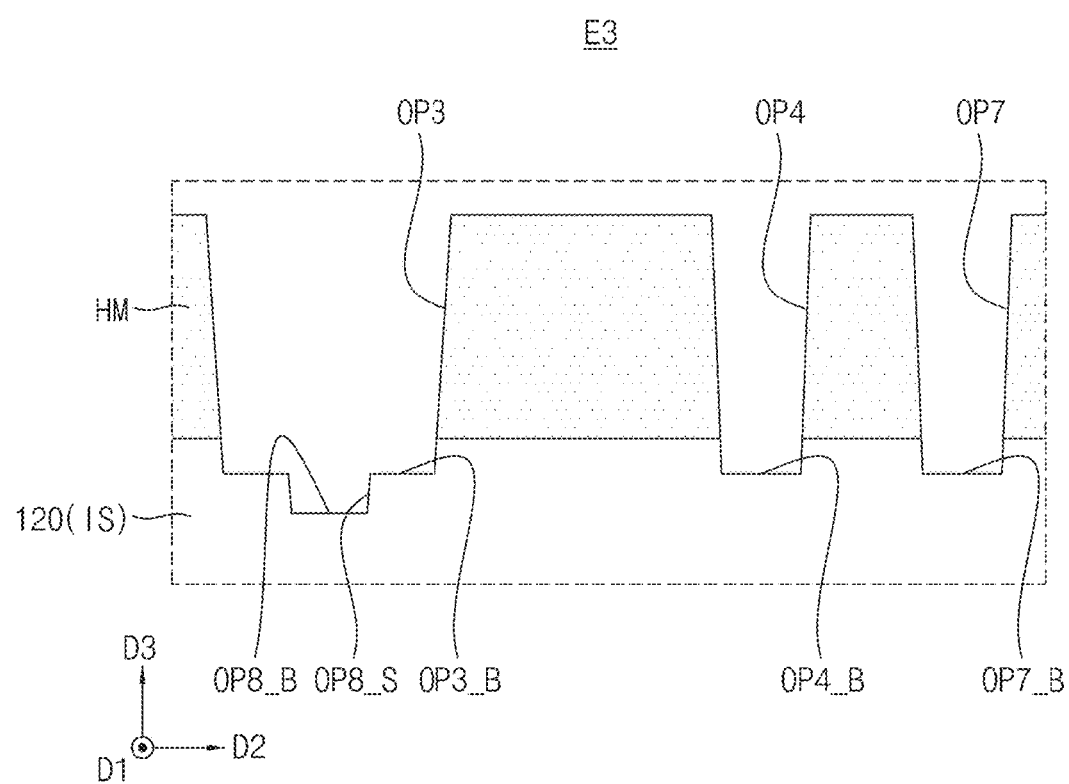
FIG. 7D is an enlarged view of a portion E3 of FIG. 7B.
Figure 8A:
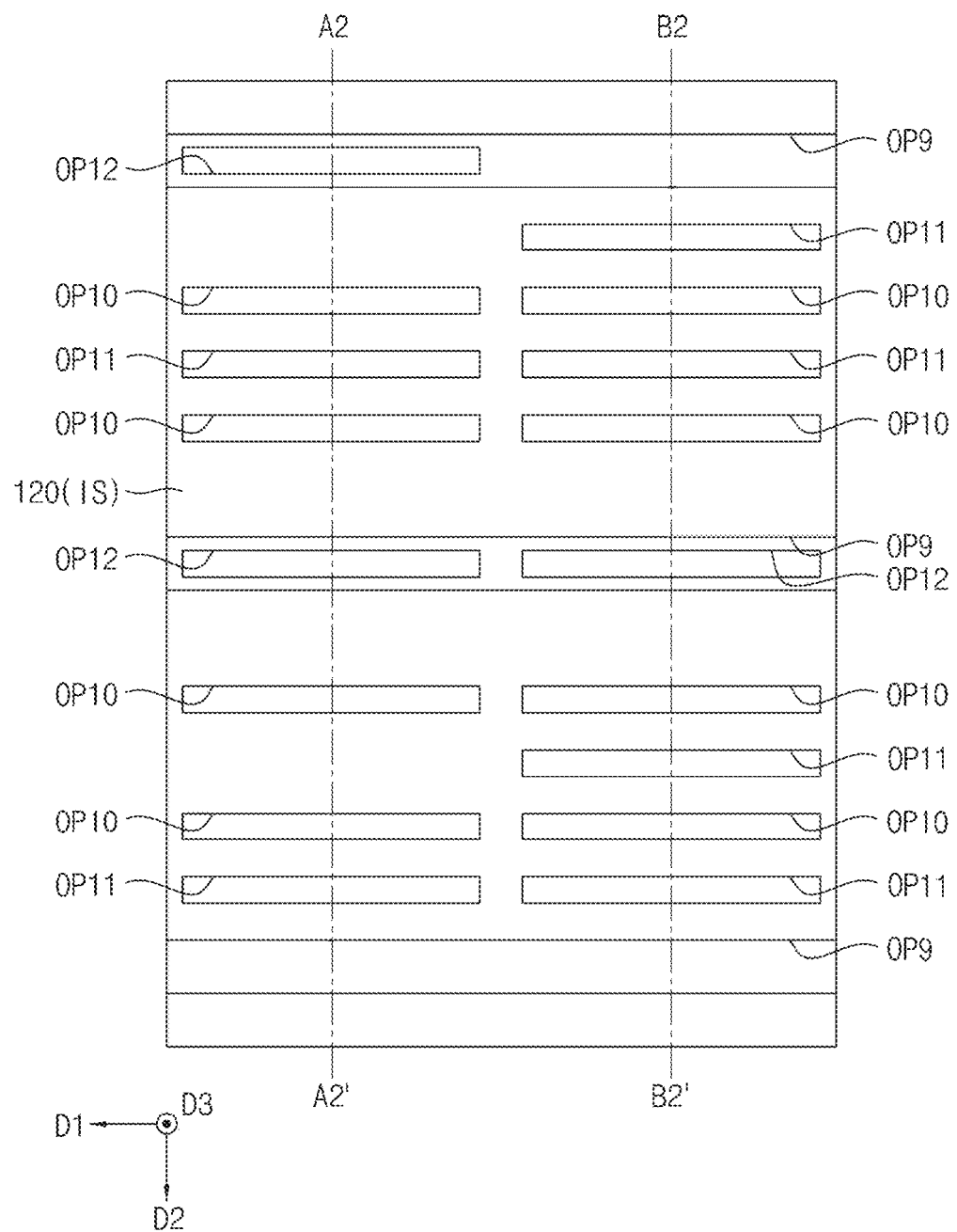
Figure 8B:
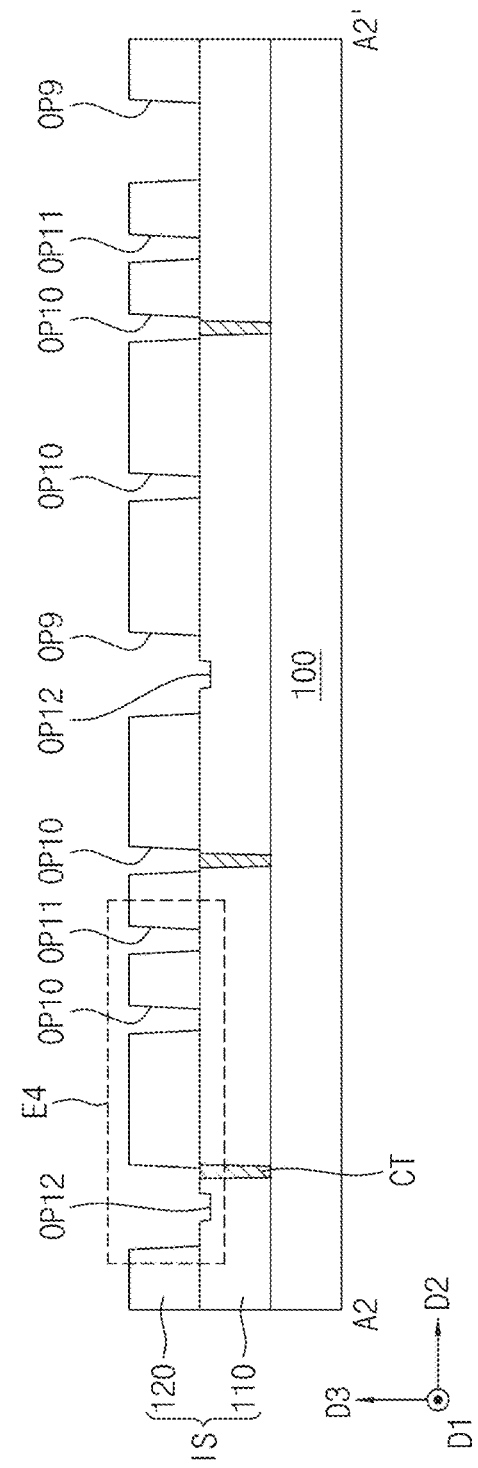
Figure 8C:
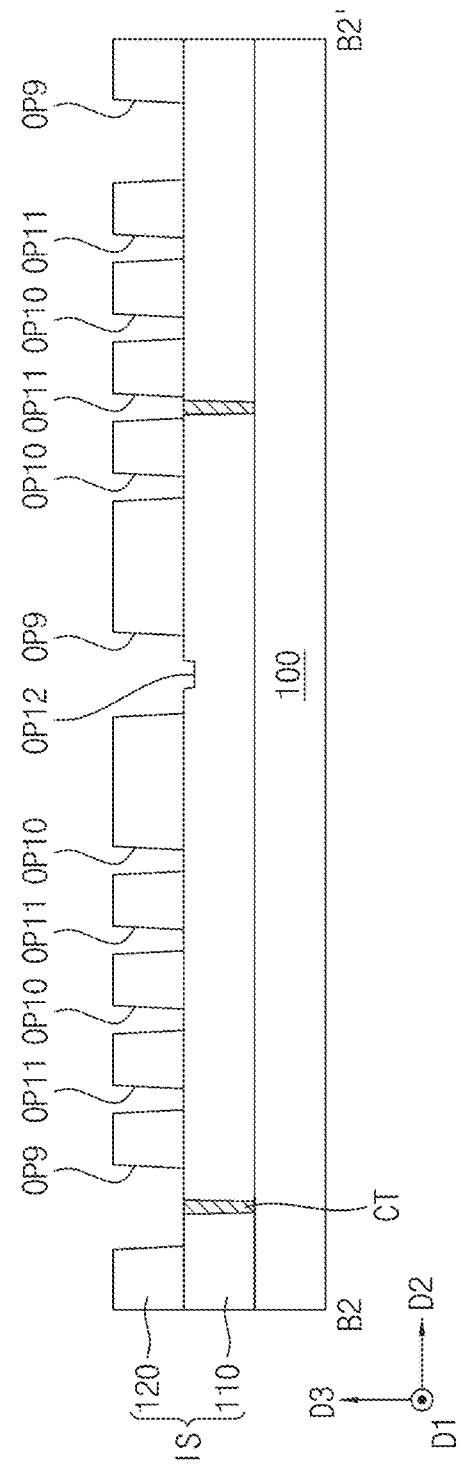
Figure 8D:
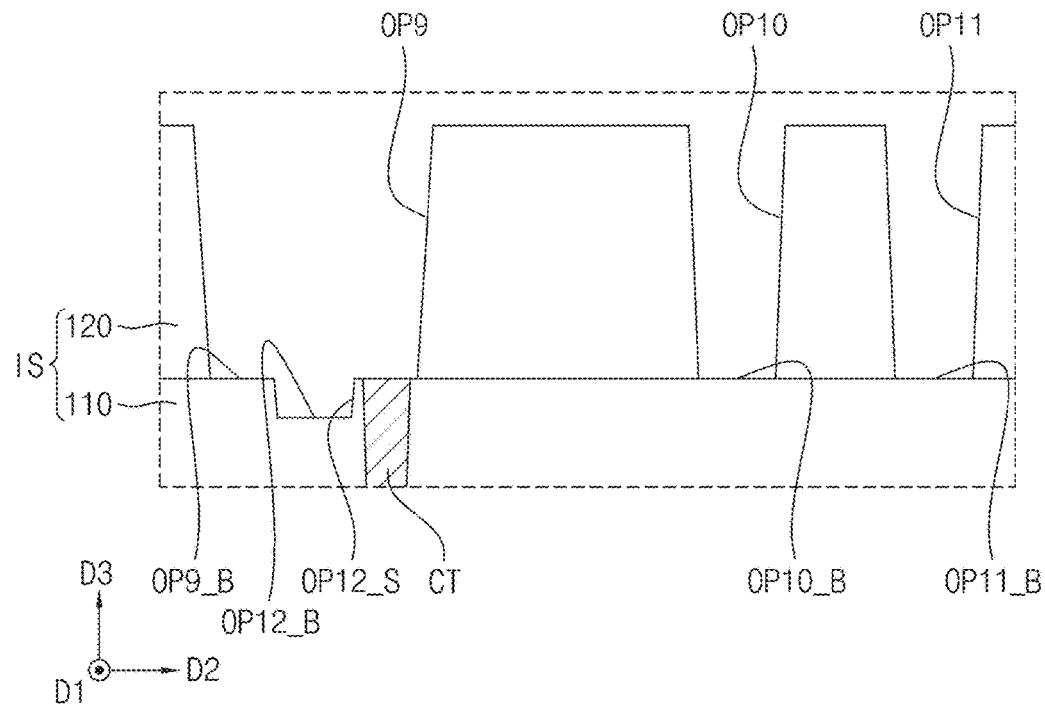
FIG. 8D is an enlarged view of a portion E4 of FIG. 8B.

FIG. 2 is a flowchart explaining a method for manufacturing a semiconductor device in accordance with some example embodiments of the disclosure. FIGS. 3A, 4A, 5A, 6A, 7A and 8A are plan views explaining the semiconductor device manufacturing method according to some example embodiments of the disclosure. FIGS. 3B, 4B, 5B, 6B, 7B and 8B are cross-sectional views taken along line A2-A2' in FIGS. 3A, 4A, 5A, 6A, 7A and 8A, respectively. FIGS. 6C, 7C and 8C are cross-sectional views taken along line B2-B2' in FIGS. 6A, 7A and 8A, respectively. FIG. 6D is an enlarged view of a portion E2 of FIG. 6B. FIG. 7D is an enlarged view of a portion E3 of FIG. 7B. FIG. 8D is an enlarged view of a portion E4 of FIG. 8B.

Figure 3A:
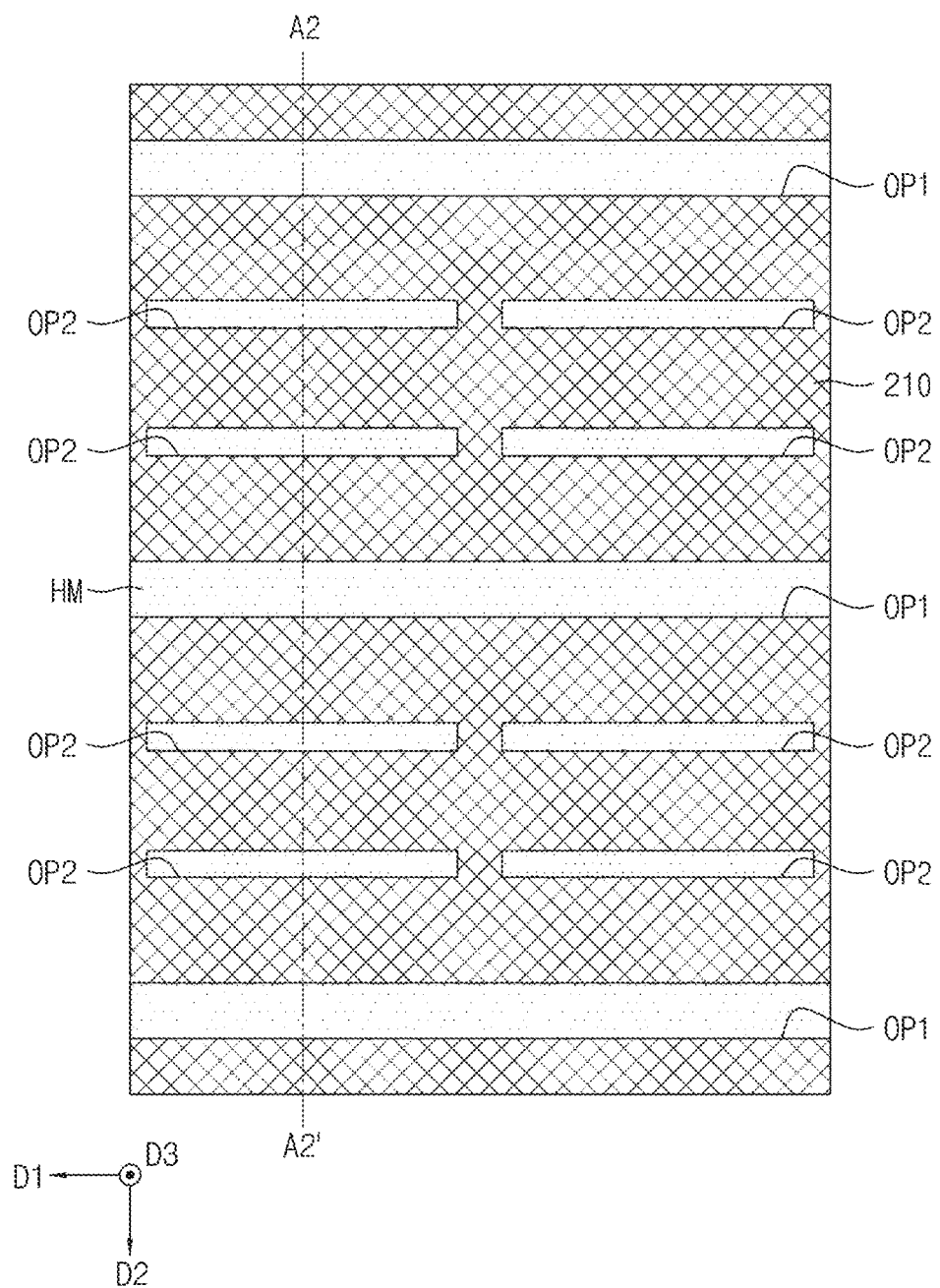
FIGS. 3A, 4A, 5A, 6A, 7A and 8A are plan views explaining a semiconductor device manufacturing method according to some example embodiments of the disclosure.
Figure 3B:
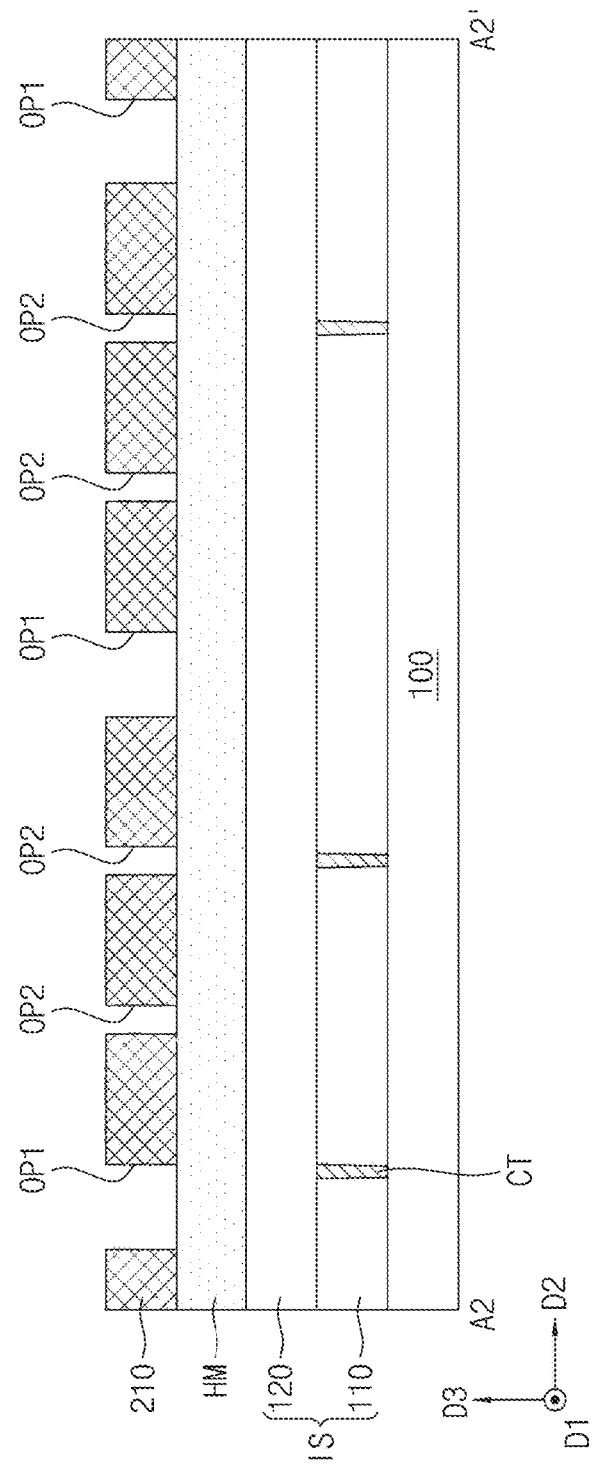

Referring to FIGS. 2, 3A and 3B, an insulating structure IS and contacts CT may be formed on a substrate 100. Formation of the insulating structure IS and the contacts CT may include forming a first insulating layer 110 on the substrate 100, forming contacts CT extending through the first insulating layer 110, and forming a second insulating layer 120 on the first insulating layer 110. In some example embodiments, a logic element or a memory element may be formed on the substrate 100 before formation of the insulating structure IS on the substrate 100.

A hard mask layer HM may be formed on the second insulating layer 120 of the insulating structure IS. The hard mask layer HM may include a material different from that of the insulating structure IS. For example, the hard mask layer HM may include titanium nitride.

A first photoresist pattern 210 may be formed on the hard mask layer HM (S10). Formation of the first photoresist pattern 210 may include forming a first photoresist layer on the hard mask layer HM, and patterning the first photoresist layer.

The first photoresist pattern 210 may include first openings OP1 and second openings OP2. Each of the first and second openings OP1 and OP2 may expose a top surface of the hard mask layer HM.

Figure 4A:
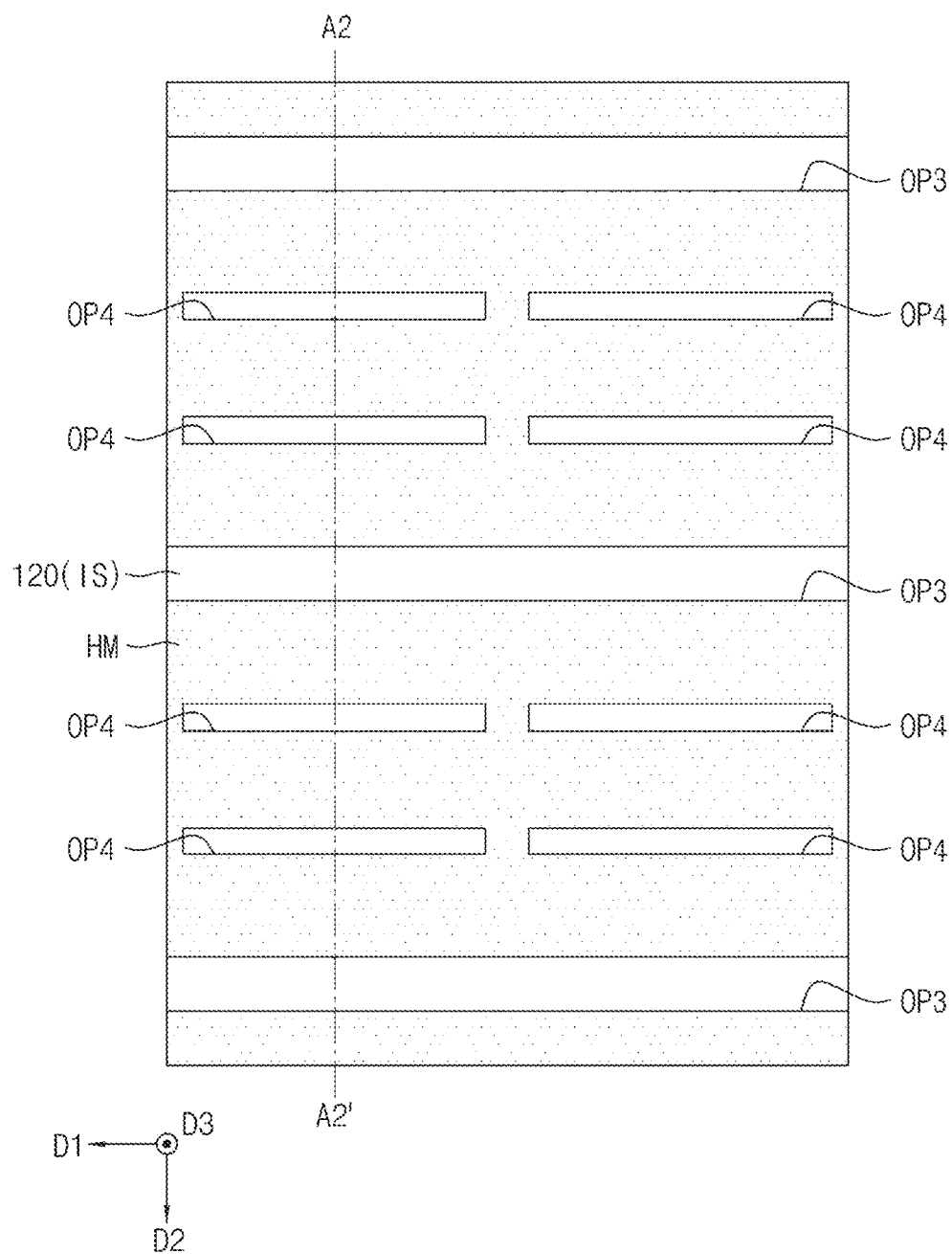
Figure 4B:
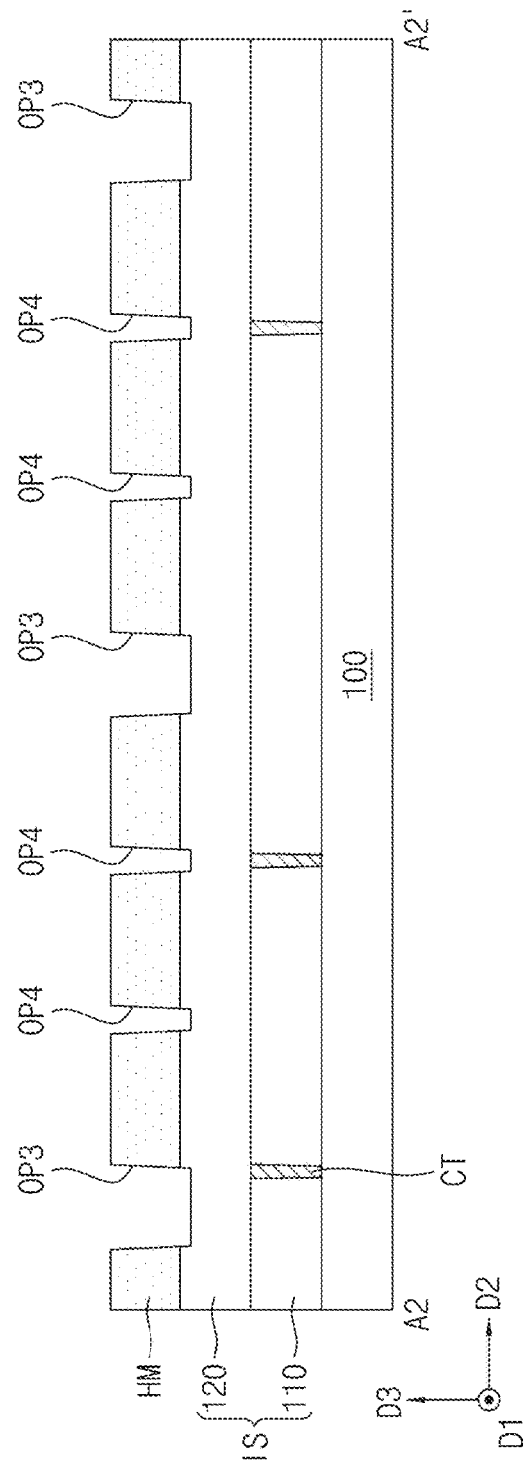

Referring to FIGS. 2, 4A and 4B, a first etching process may be performed using the first photoresist pattern 210 as an etch mask (S20). In some example embodiments, the hard mask layer HM, the second insulating layer 120 of the insulating structure IS and the first photoresist pattern 210 may be etched through the first etching process. The first photoresist pattern 210 may be completely removed through the first etching process.

As the first etching process is performed, third openings OP3 and fourth openings OP4 may be formed. The hard mask layer HM may be etched through the first openings OP1 and, as such the third openings OP3 may be formed. The first openings OP1 may be transferred to the hard mask layer HM and, as such, the third openings OP3 may be formed. The third openings OP3 may be defined by the hard mask layer HM and the second insulating layer 120 of the insulating structure IS. As the hard mask layer HM is etched through the second openings OP2, the fourth openings OP4 may be formed. The second openings OP2 may be transferred to the hard mask layer HM and, as such, the fourth openings OP4 may be formed. The fourth openings OP4 may be defined by the hard mask layer HM and the second insulating layer 120 of the insulating structure IS. The third and fourth openings OP3 and OP4 may expose side walls of the hard mask layer HM and a top surface of the second insulating layer 120 of the insulating structure IS. A plurality of fourth openings OP4 may be disposed between adjacent ones of the third openings OP3 in a second direction D2, respectively.

Figure 5A:
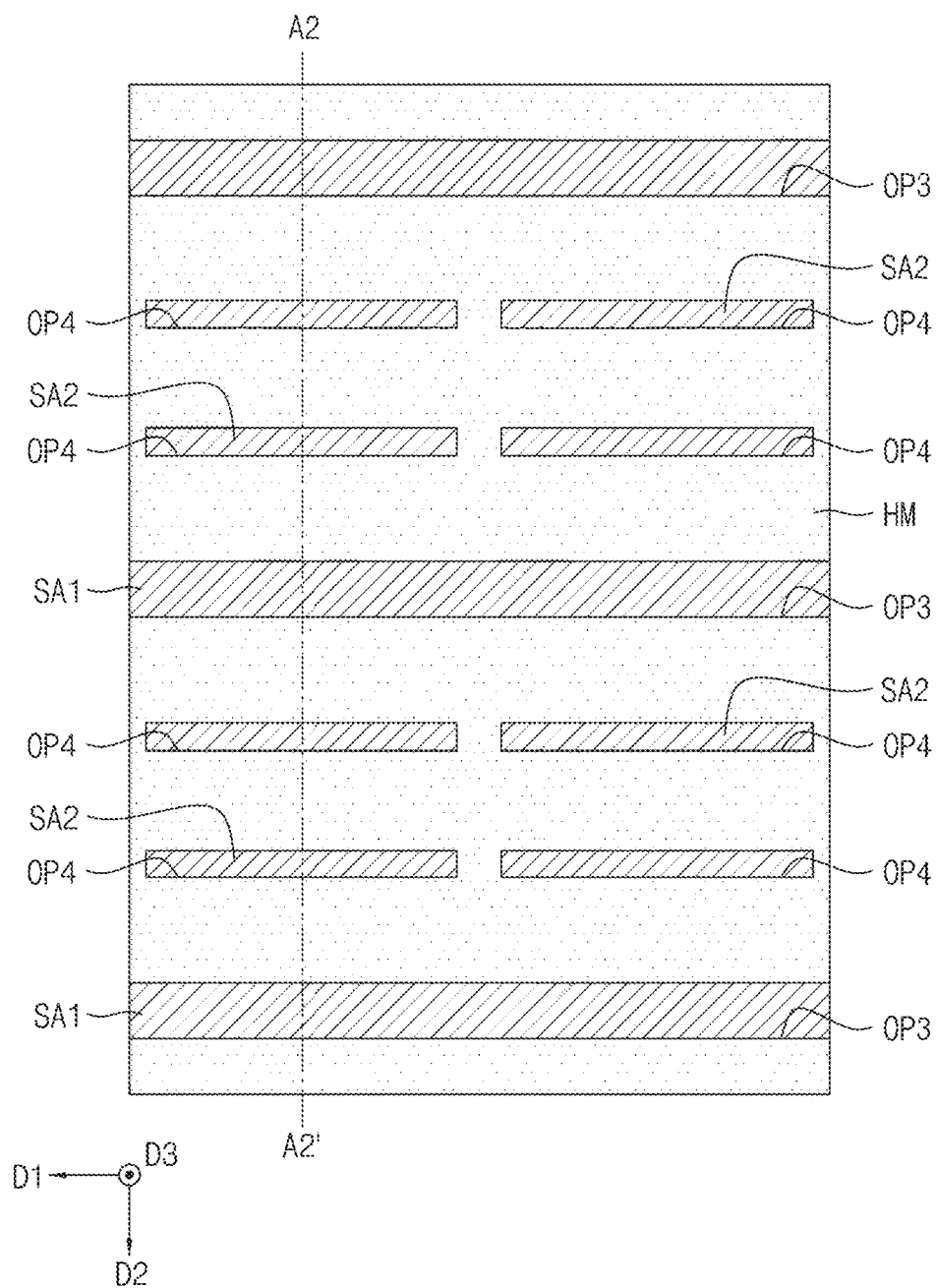
Figure 5B:
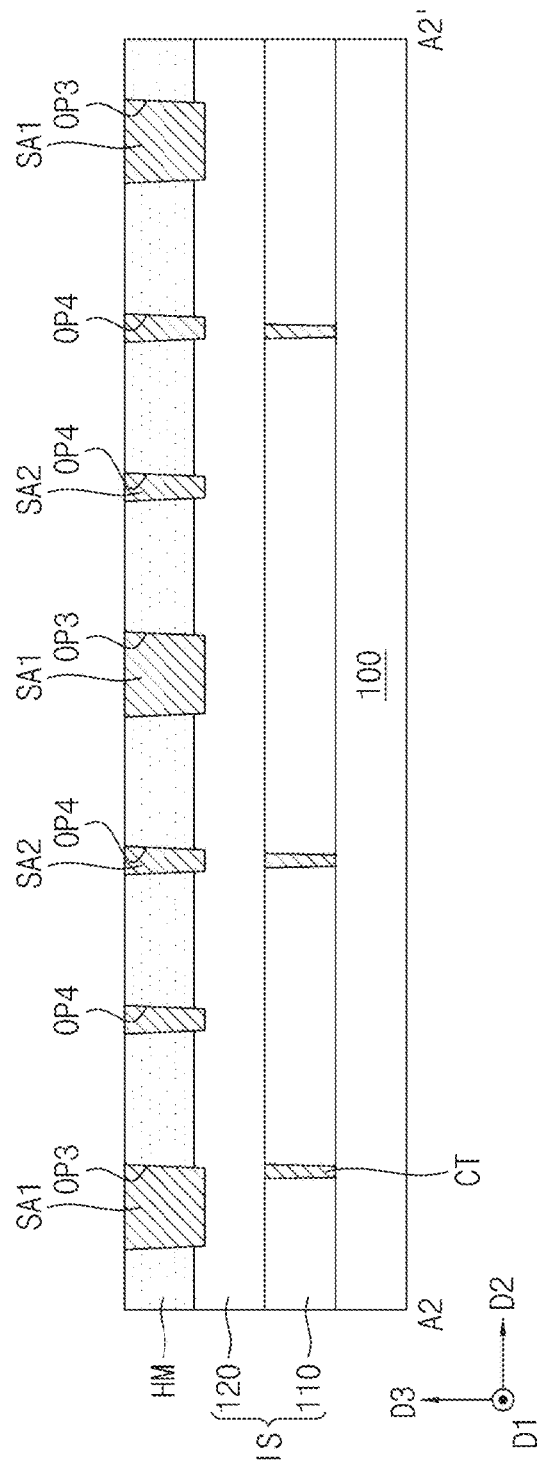

Referring to FIGS. 2, 5A and 5B, first sacrificial patterns SA1 may be formed in the third openings OP3, and second sacrificial patterns SA2 may be formed in the fourth openings OP4 (S30). The first sacrificial patterns SA1 may fill the third openings OP3, respectively. The second sacrificial patterns SA2 may fill the fourth openings OP4, respectively. The first and second sacrificial patterns SA1 and SA2 may include a material different from those of the insulating structure IS and the hard mask layer HM. For example, the first and second sacrificial patterns SA1 and SA2 may include SiCOH.

Referring to FIGS. 2, 6A, 6B, 6C and 6D, a second photoresist pattern 220 may be formed on the first and second sacrificial patterns SA1 and SA2 and the hard mask layer HM (S40). Formation of the second photoresist pattern 220 may include forming a second photoresist layer on the first and second sacrificial patterns SA1 and SA2 and the hard mask layer HM, and patterning the second photoresist layer.

The second photoresist pattern 220 may include fifth openings OP5 and sixth openings OP6. Each fifth opening OP5 may expose a top surface of the hard mask layer HM. A bottom surface of the fifth opening OP5 may be defined by the top surface of the hard mask layer HM. The fifth openings OP5 may be disposed between adjacent ones of the first and second sacrificial patterns SA1 and SA2 in the second direction D2 or between adjacent ones of the second sacrificial patterns SA2 in the second direction D2, respectively. The fifth openings OP5 may overlap in a third direction D3 portions of the hard mask layer HM disposed between adjacent ones of the first and second sacrificial patterns SA1 and SA2 in the second direction D2 or portions of the hard mask layer HM disposed between adjacent ones of the second sacrificial patterns SA2 in the second direction D2, respectively. Each of the fifth openings OP5 may not overlap the first and second sacrificial patterns SA1 and SA2.

The second photoresist pattern 220 may expose a first portion SA1_T1 of a top surface of each first sacrificial pattern SA1, and may cover a second portion SA1_T2 of the top surface of the first sacrificial pattern SAL The first portion SA_T1 of the top surface of the first sacrificial pattern SA1 may be surrounded by the second portion SA1_T2 of the top surface of the first sacrificial pattern SA1.

Each sixth opening OP6 may expose the first portion SA1_T1 of the top surface of the first sacrificial pattern SA1. A bottom surface of the sixth opening OP6 may be defined by the first portion SA1_T1 of the first sacrificial pattern SAL The sixth opening OP6 may be disposed over the first sacrificial pattern SAL For example, the sixth opening OP6 may be disposed over the first sacrificial pattern SA1 in a vertical direction. The sixth opening OP6 may overlap the first sacrificial pattern SA1 in a third direction D3. For example, the sixth opening OP6 may overlap the first sacrificial pattern SA1 in a vertical direction. The first sacrificial patterns SA1 may include first sacrificial patterns SA1 overlapping a plurality of sixth openings OP6 in the third direction D3.

The maximum width of the sixth opening OP6 may be smaller than the minimum width of the first sacrificial pattern SA1. For example, the maximum value of a width W1 of the sixth opening OP6 in the second direction D2 may be smaller than the maximum value of a width W2 of the first sacrificial pattern SA1 in the second direction D2. The maximum width of the sixth opening OP6 may be smaller than the minimum width of each third opening OP3. For example, the maximum value of the width W1 of the sixth opening OP6 in the second direction D2 may be smaller than the maximum value of a width W2 of the third opening OP3 in the second direction D2. In some example embodiments, the width of the sixth opening OP6 may equal to the width of each fifth opening OP5. The second photoresist pattern 220 may cover top surfaces of the second sacrificial patterns SA2.

Referring to FIGS. 2, 7A, 7B, 7C and 7D, a second etching process may be performed using the second photoresist pattern 220 as an etch mask (S50). In some example embodiments, the hard mask layer HM, the first and second sacrificial patterns SA1 and SA2, the second insulating layer 120 of the insulating structure IS, and the second photoresist pattern 220 may be etched through the second etching process. Each of the first and second sacrificial patterns SA1 and SA2, and the second photoresist pattern 220 may be completely removed through the second etching process. The first sacrificial patterns SA1 may be completely removed from the third openings OP3. The second sacrificial patterns SA2 may be completely removed from the fourth opening OP4.

As the second etching process is performed, the third and fourth openings OP3 and OP4 may be opened and, as such, seventh openings OP7 and eighth openings OP8 may be formed.

Opening of the third openings OP3 may include etching the first portions SA1_T1 of the top surfaces of the first sacrificial patterns SA1 exposed through the sixth openings OP6, etching the second photoresist pattern 220, thereby exposing the second portions SA1_T2 of the top surfaces of the first sacrificial patterns SA1, and etching the exposed second portions SA1_T2 of the top surfaces of the first sacrificial patterns SA1.

Opening of the fourth openings OP4 may include etching the second photoresist pattern 220, thereby exposing the top surfaces of the second sacrificial patterns SA2, and etching the exposed top surfaces of the second sacrificial patterns SA2.

Formation of the seventh openings OP7 may include etching the hard mask layer HM through the fifth openings OP5. As the fifth openings OP5 are transferred to the hard mask layer HM, the seventh openings OP7 may be formed. Formation of the eighth openings OP8 may include etching the first portions SA1_T1 of the top surfaces of the first sacrificial patterns SA1 through the sixth openings OP6, thereby exposing portions of bottom surfaces OP3_B of the third openings OP3, etching the exposed portions of the bottom surfaces OP3_B of the third openings OP3. As the sixth openings OP6 are transferred to the second insulating layer 120 of the insulating structure IS, the eighth openings OP8 may be formed.

The seventh openings OP7 may be defined by the hard mask layer HM and the second insulating layer 120 of the insulating structure IS. The eighth openings OP8 may be defined by the second insulating layer 120 of the insulating structure IS.

The eighth openings OP8 may be connected to the third openings OP3. The third openings OP3 may include a third opening OP3 connected to a plurality of eighth openings OP8. The eighth opening OP8 may overlap the third opening OP3 in the third direction D3. For example, the eighth opening OP8 may overlap the third opening OP3 in a vertical direction. The maximum width of the eighth opening OP8 may be smaller than the minimum width of the third opening OP3. For example, the maximum width of the eighth opening OP8 in the second direction D2 may be smaller than the minimum width of the third opening OP3 in the second direction D2. The maximum width of the seventh opening OP7 may be smaller than the minimum width of the third opening OP3. For example, the maximum width of the seventh opening OP7 in the second direction D2 may be smaller than the minimum width of the third opening OP3 in the second direction D2.

The level of a bottom surface OP8_B of the eighth opening OP8 may be lower than the level of the bottom surface OP3_B of the third opening OP3. A side wall OP8_S of the eighth opening OP8 may connect the bottom surface OP3_B of the third opening OP3 and the bottom surface OP8_B of the eighth opening OP8. The level of the bottom surface OP8_B of the eighth opening OP8 may be lower than the level of a bottom surface OP4_B of the fourth opening OP4. The level of the bottom surface OP8_B of the eighth opening OP8 may be lower than the level of a bottom surface OP7_B of the seventh opening OP7. The level of the bottom surface OP7_B of the seventh opening OP7, the level of the bottom surface OP3_B of the third opening OP3, and the level of the bottom surface OP4_B of the fourth opening OP4 may be the same.

Referring to FIGS. 2, 8A, 8B and 8C, a third etching process may be performed using the hard mask layer HM using an etch mask (S60). In some example embodiments, the hard mask layer HM and the insulating structure IS may be etched through the third etching process. The hard mask layer HM may be completely removed through the third etching process. In other words, the overall portion of the hard mask layer HM may be removed through the third etching process.

As the third etching process is performed, ninth openings OP9, tenth openings OP10, eleventh openings OP11, and twelfth openings OP12 may be formed. As the insulating structure IS is etched through the third and eighth openings OP3 and OP8, the ninth and twelfth openings OP9 and OP12 may be formed. As the third openings OP3 are transferred to the insulating structure IS, the ninth openings OP9 may be formed. The eighth openings OP8 may be transferred to the first insulating layer 110 of the insulating structure IS and, as such, the twelfth openings OP12 may be formed. The ninth openings OP9 may be defined by the first and second insulating layers 110 and 120 of the insulating structure IS. The twelfth openings OP12 may be defined by the first insulating layer 110 of the insulating structure IS.

As the insulating structure IS etched through the fourth openings OP4, the tenth openings OP10 may be formed. The fourth openings OP4 may be transferred to the insulating structure IS and, as such, the tenth openings OP10 may be formed. The tenth openings OP10 may be defined by the first and second insulating layers 110 and 120 of the insulating structure IS.

As the insulating structure IS is etched through the seventh openings OP7, the eleventh openings OP11 may be formed. The seventh openings OP7 may be transferred to the insulating structure IS and, as such, the eleventh openings OP11 may be formed. The eleventh openings OP11 may be defined by the first and second insulating layers 110 and 120 of the insulating structure IS.

The twelfth openings OP12 may be connected to the ninth openings OP9. The ninth openings OP9 may include a ninth opening OP9 connected to a plurality of twelfth openings OP12. The twelfth opening OP12 may overlap the ninth opening OP9 in the third direction D3. For example, the twelfth opening OP12 may overlap the ninth opening OP9 in a vertical direction. The maximum width of the twelfth opening OP12 may be smaller than the minimum width of the ninth opening OP9. For example, the maximum width of the twelfth opening OP12 in the second direction D2 may be smaller than the minimum width of the ninth opening OP9 in the second direction D2. The maximum width of the eleventh opening OP11 may be smaller than the minimum width of the ninth opening OP9. For example, the maximum width of the eleventh opening OP11 in the second direction D2 may be smaller than the minimum width of the ninth opening OP9 in the second direction D2.

The level of a bottom surface OP12_B of the twelfth opening OP12 may be lower than the level of a bottom surface OP9_B of the ninth opening OP9. A side wall OP12_S of the twelfth opening OP12 may connect the bottom surface OP9_B of the ninth opening OP9 and the bottom surface OP12_B of the twelfth opening OP12. The level of the bottom surface OP12_B of the twelfth opening OP12 may be lower than the level of a bottom surface OP10_B of each tenth opening OP10. The level of the bottom surface OP12_B of the twelfth opening OP12 may be lower than the level of a bottom surface OP11_B of each eleventh opening OP11. The level of the bottom surface OP11_B of the eleventh opening OP11, the level of the bottom surface OP9_B of the ninth opening OP9, and the level of the bottom surface OP10_B of the tenth opening OP10 may be the same.

Through the third etching process, the ninth to twelfth openings OP9, OP10, OP11 and OP12 may be formed to expose the contacts CT.

Referring to FIGS. 2, 1A, 1B, 1C and 1D, first to third conductive lines CL1, CL2 and CL3 may be formed in the ninth to twelfth openings OP9, OP10, OP11 and OP12 (S70). Formation of the first to third conductive lines CL1, CL2 and CL3 may include filling the ninth to twelfth openings OP9, OP10, OP11 and OP12 with a conductive material. The first conductive lines CL1 may be formed by filling the ninth openings OP9 with a conductive material or filling the ninth and twelfth openings OP9 and OP12 with a conductive material. The second conductive lines CL2 may be formed by filling the tenth openings OP10 with a conductive material. The third conductive lines CL3 may be formed by filling the eleventh openings OP11 with a conductive material. The first to third conductive lines CL1, CL2 and CL3 may be simultaneously formed.

The semiconductor device manufacturing method according to the above example embodiments of the disclosure may include the process of etching the first sacrificial patterns SA1 using the sixth openings OP6 of the second photoresist pattern 220. Thus, openings of the second photoresist pattern 220 may be relatively uniformly arranged. Accordingly, uniformity of the process of forming the second photoresist pattern 220 and the etching process using the second photoresist pattern 220 may be enhanced.

Figure 9:
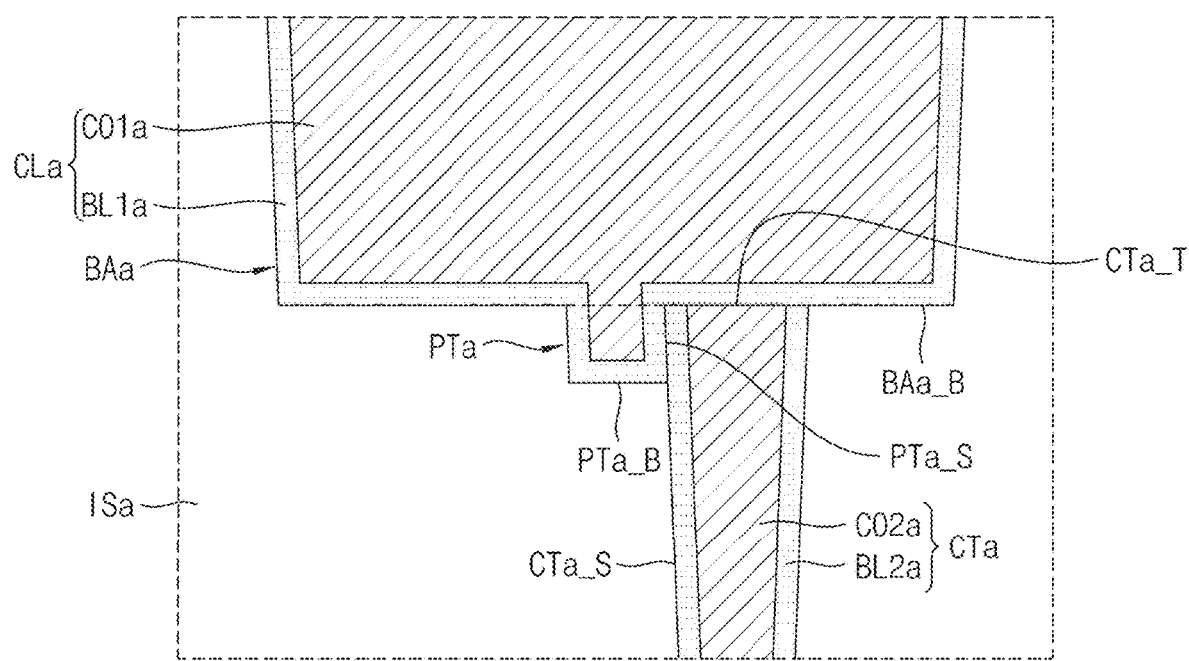
FIG. 9 is a cross-sectional view explaining a conductive line and a contact in a semiconductor device according to some example embodiments of the disclosure.

FIG. 9 is a cross-sectional view explaining a conductive line and a contact in a semiconductor device according to some example embodiments of the disclosure.

Referring to FIG. 9, a semiconductor device 2 may include an insulating structure ISa, and a conductive line CLa and a contact CTa in the insulating structure Isa.

The conductive line CLa may include a first barrier layer BL1a and a first conductive layer CO1a. The first barrier layer BL1a may surround the first conductive layer CO1a. The first barrier layer BL1a may cover a bottom surface and a side wall of the first conductive layer CO1a. The first barrier layer BL1a and the first conductive layer CO1a may include different conductive materials, respectively. For example, the first barrier layer BL1a may include tantalum nitride, and the first conductive layer CO1a may include copper.

The contact CTa may include a second barrier layer BL2a and a second conductive layer CO2a. The second barrier layer BL2a may surround the second conductive layer CO2a. The second barrier layer BL2a may cover a bottom surface and a side wall of the second conductive layer CO2a. The second barrier layer BL2a and the second conductive layer CO2a may include different conductive materials, respectively.

The conductive line CLa may include a base BAa and a protrusion PTa. The protrusion PTa may protrude from a bottom surface BAa_B of the base BAa. Each of the base BAa and the protrusion PTa may include a part of the first barrier layer BL1a and a part of the first conductive layer CO1a. The contact CTa may contact the base BAa and the protrusion PTa of the conductive line CLa. A top surface CTa_T of the contact CTa may contact the bottom surface BAa_B of the base BAa. A side wall CTa_S of the contact CTa may contact a bottom surface PTa_B and a side wall PTa_S of the protrusion PTa. The second barrier layer BL2*a* and the second conductive layer CO2*a* of the contact CTa may contact the first barrier layer BL1*a* of the conductive line CLa. The contact CTa may be spaced apart from the first conductive layer CO1*a*.

Figure 10:
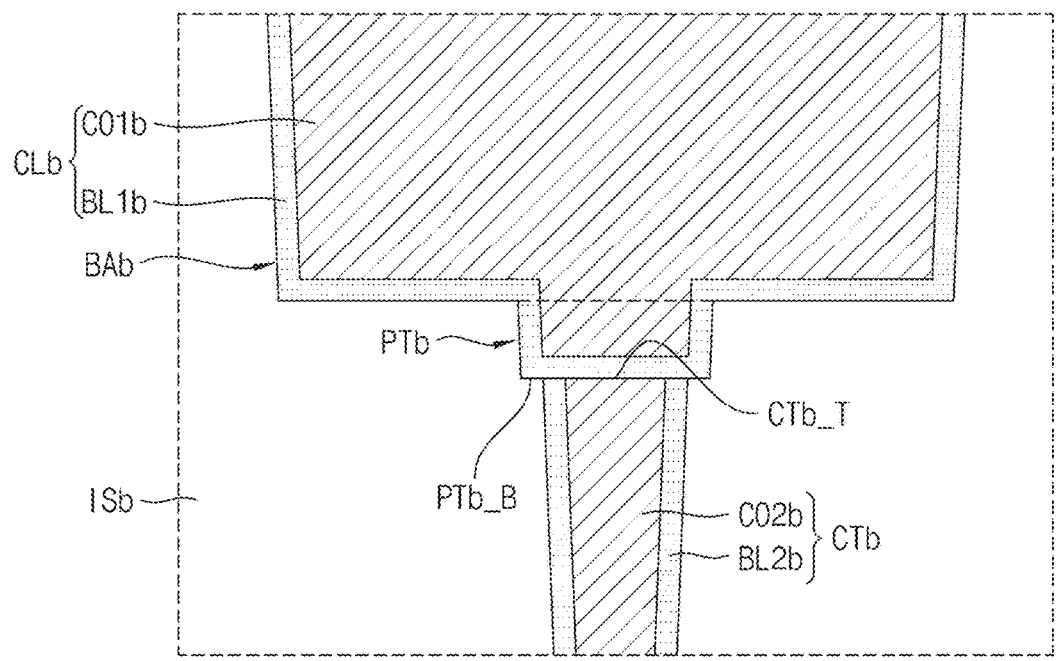
FIG. 10 is a cross-sectional view explaining a conductive line and a contact in a semiconductor device according to some example embodiments of the disclosure.

FIG. 10 is a cross-sectional view explaining a conductive line and a contact in a semiconductor device according to some example embodiments of the disclosure.

Referring to FIG. 10, a semiconductor device 3 may include an insulating structure ISb, and a conductive line CLb and a contact CTb in the insulating structure ISb.

The conductive line CLb may include a first barrier layer BL1*b* and a first conductive layer CO1*b*. The contact CTb may include a second barrier layer BL2*b* and a second conductive layer CO2*b*.

The conductive line CLb may include a base BAb and a protrusion PTb. The contact CTb may contact the protrusion PTb of the conductive line CLb. A top surface CTb_T of the contact CTb may contact a bottom surface PTb_B of the protrusion PTb. The contact CTb may be spaced apart from the base BAb. The second barrier layer BL2*b* and the second conductive layer CO2*b* of the contact CTb may contact the first barrier layer BL1*b* of the conductive line CLb.

Figure 11:
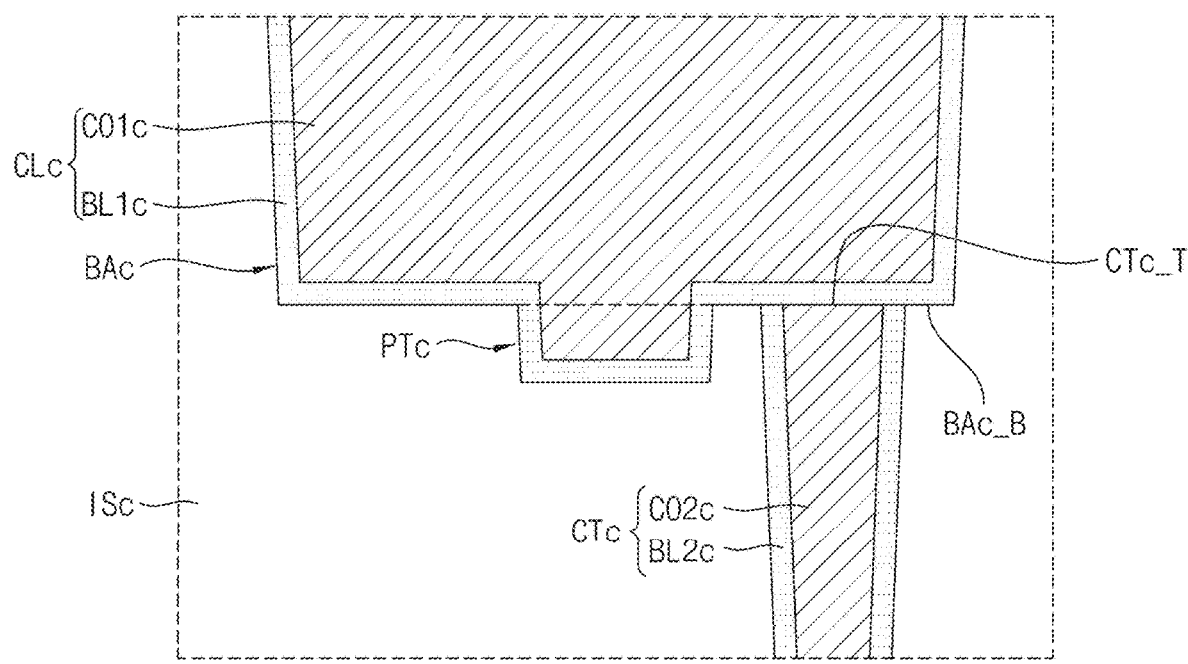
FIG. 11 is a cross-sectional view explaining a conductive line and a contact in a semiconductor device according to some example embodiments of the disclosure.

FIG. 11 is a cross-sectional view explaining a conductive line and a contact in a semiconductor device according to some example embodiments of the disclosure.

Referring to FIG. 11, a semiconductor device 4 may include an insulating structure ISc, and a conductive line CLc and a contact CTc in the insulating structure ISc.

The conductive line CLc may include a first barrier layer BL1*c* and a first conductive layer CO1*c*. The contact CTc may include a second barrier layer BL2*c* and a second conductive layer CO2*c*.

The conductive line CLc may include a base Bac and a protrusion PTc. The contact CTc may contact the base BAc of the conductive line CLc. A top surface CTc_T of the contact CTc may contact a bottom surface BAc_B of the base BAc. The contact CTc may be spaced apart from the protrusion PTc. The second barrier layer BL2*c* and the second conductive layer CO2*c* of the contact CTc may contact the first barrier layer BL1*c* of the conductive line CLc.

Figure 12A:
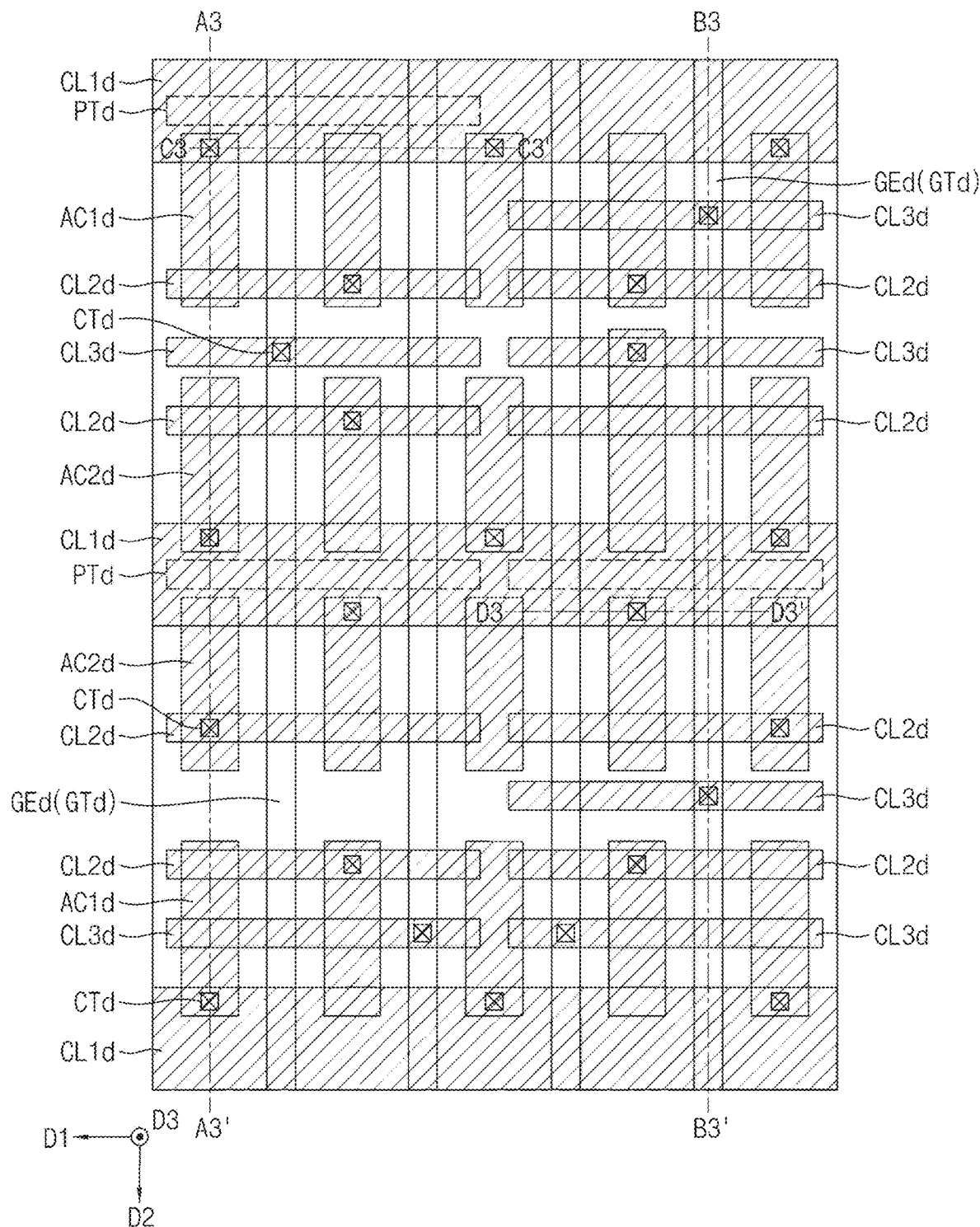
FIG. 12A is a plan view of a semiconductor device according to some example embodiments of the disclosure.
Figure 12B:
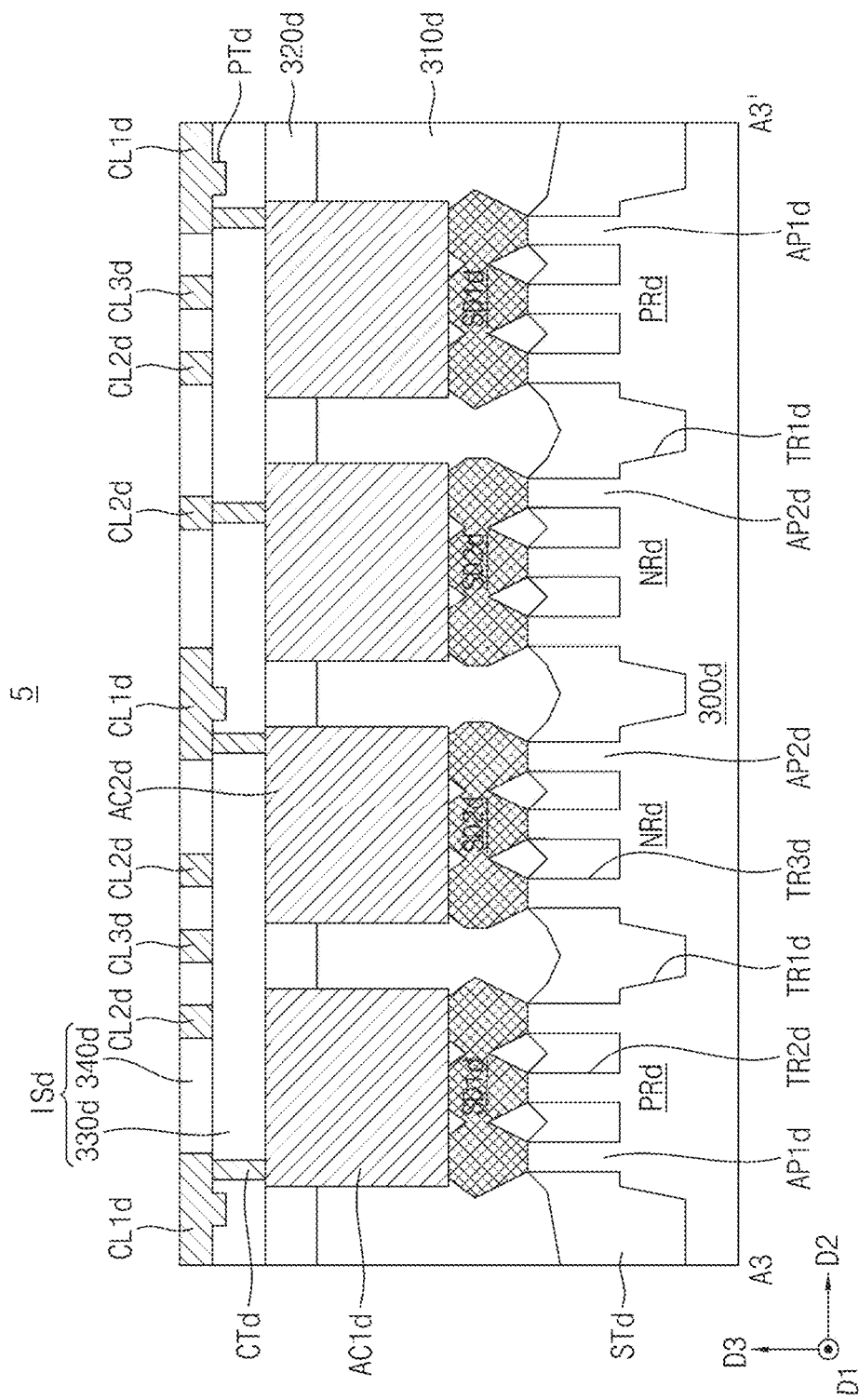
FIG. 12B is a cross-sectional view taken along line A3-A3' in FIG. 12A.
Figure 12C:
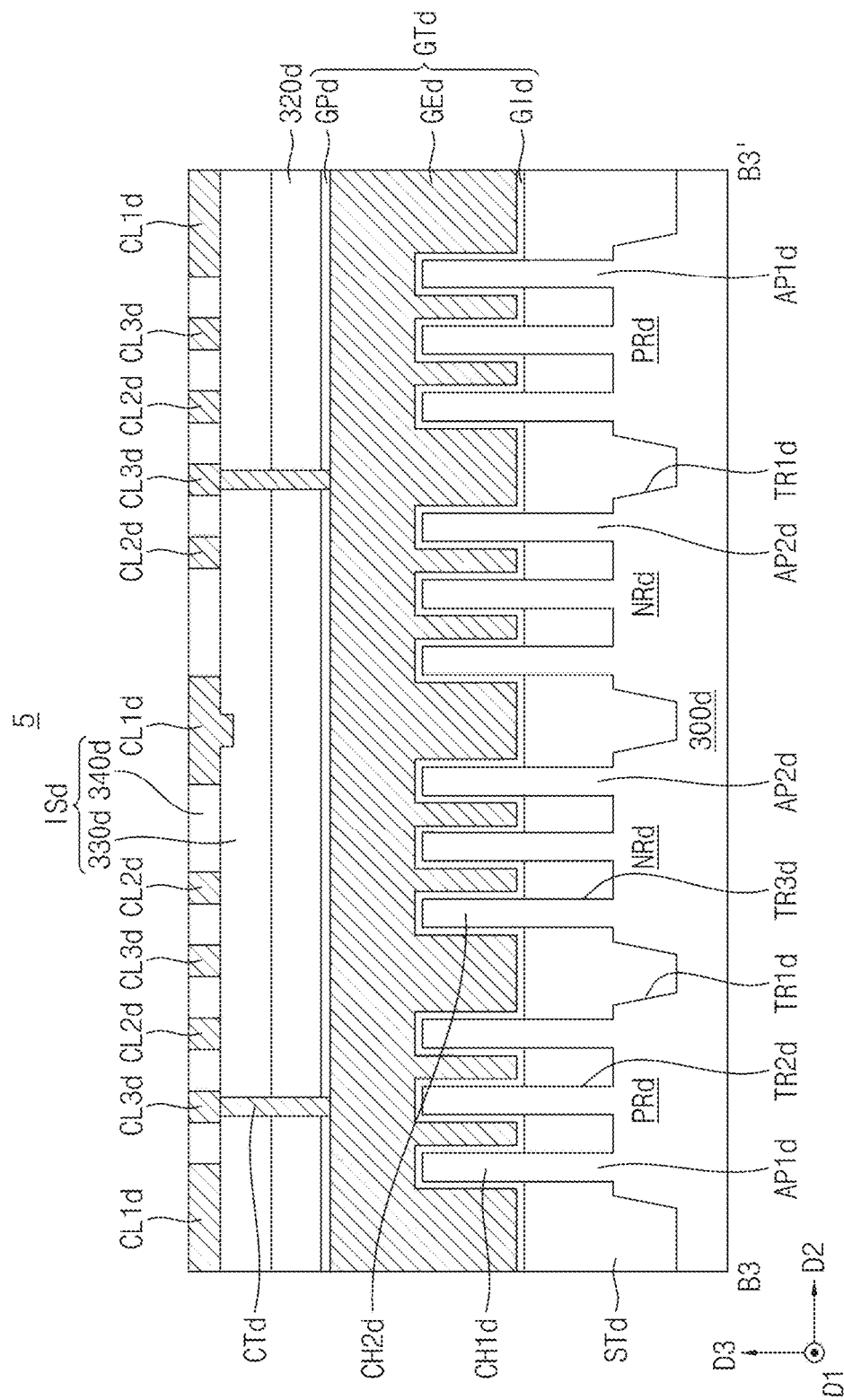
FIG. 12C is a cross-sectional view taken along line B3-B3' in FIG. 12A.
Figure 12D:
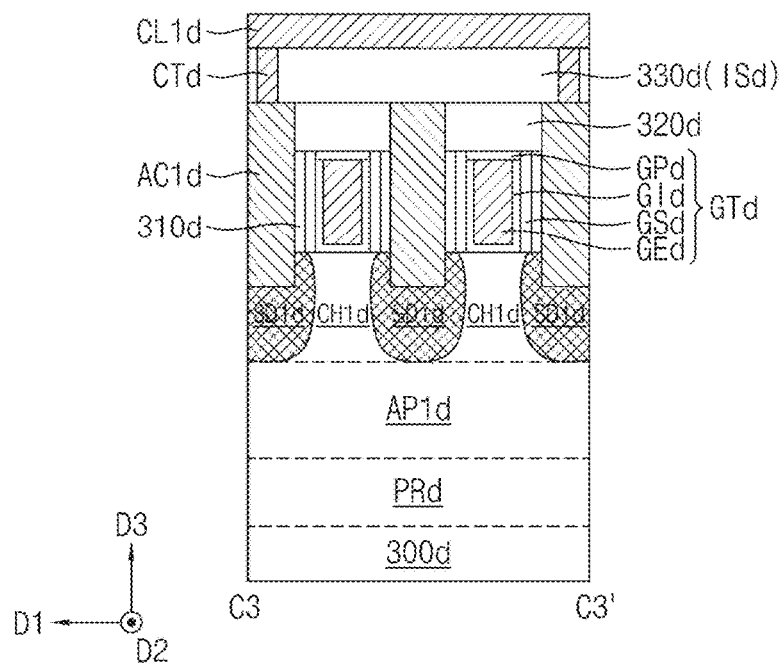
FIG. 12D is a cross-sectional view taken along line C3-C3' in FIG. 12A.
Figure 12E:
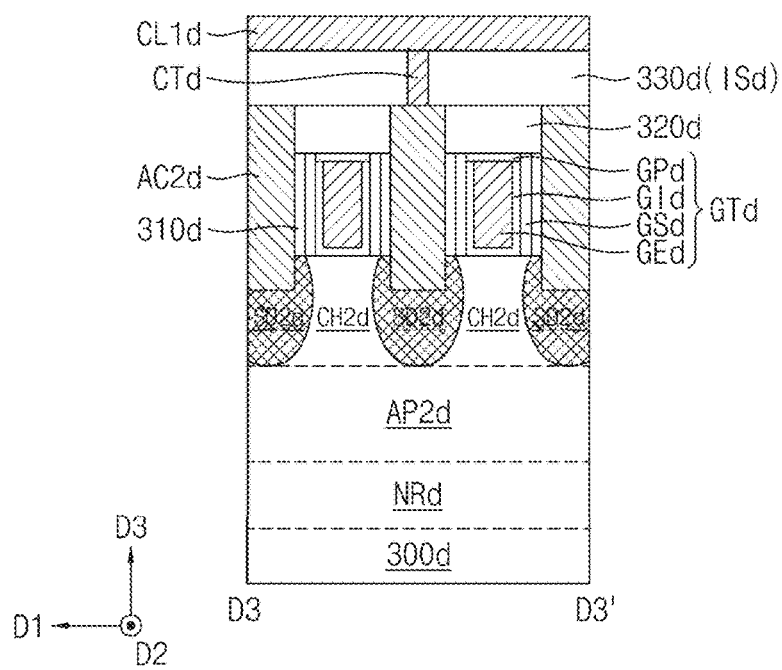
FIG. 12E is a cross-sectional view taken along line D3-D3' in FIG. 12A.
Figure 13A:
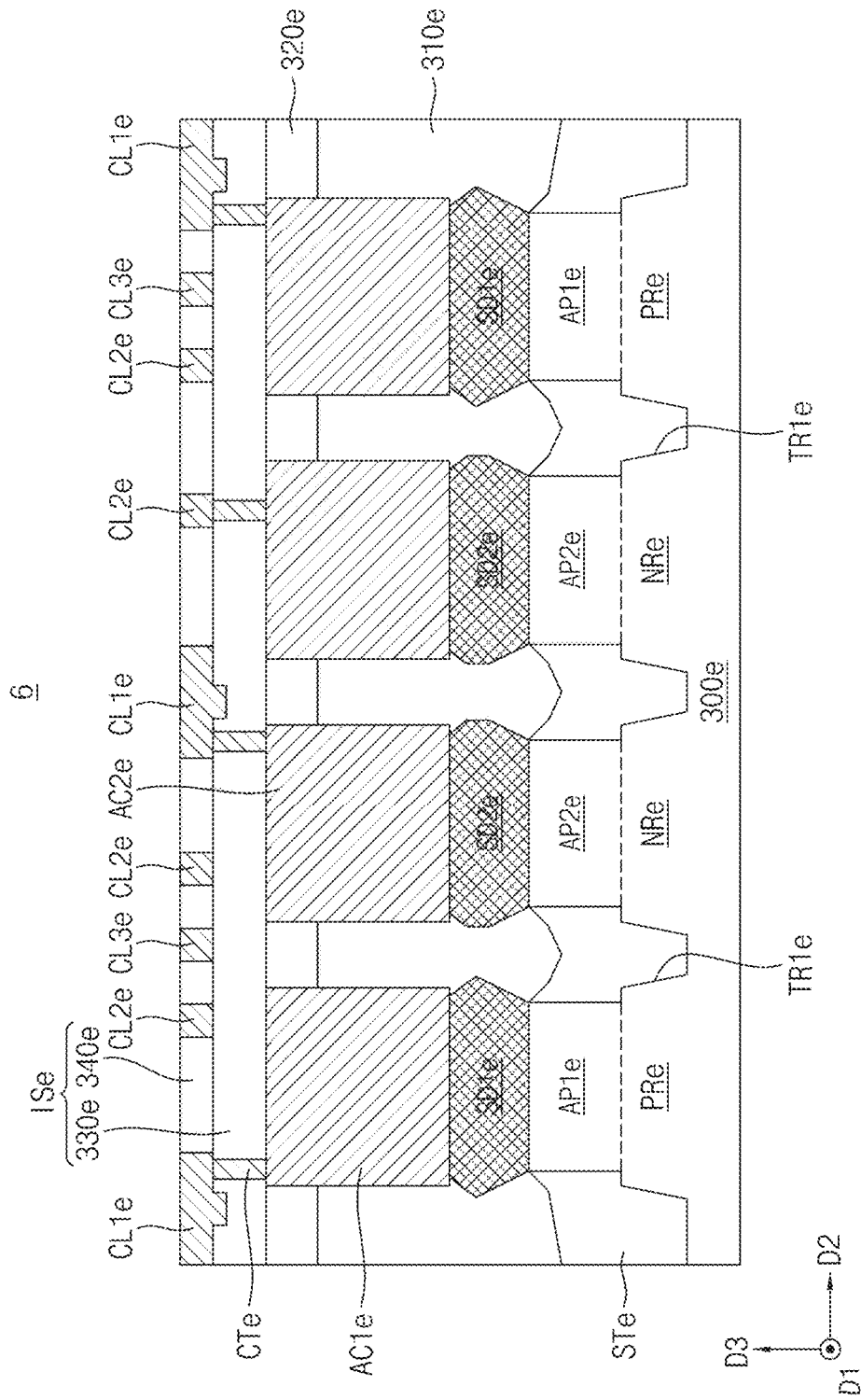
FIGS. 13A, 13B, 13C and 13D are cross-sectional views explaining a semiconductor device according to some example embodiments of the disclosure.
Figure 13B:
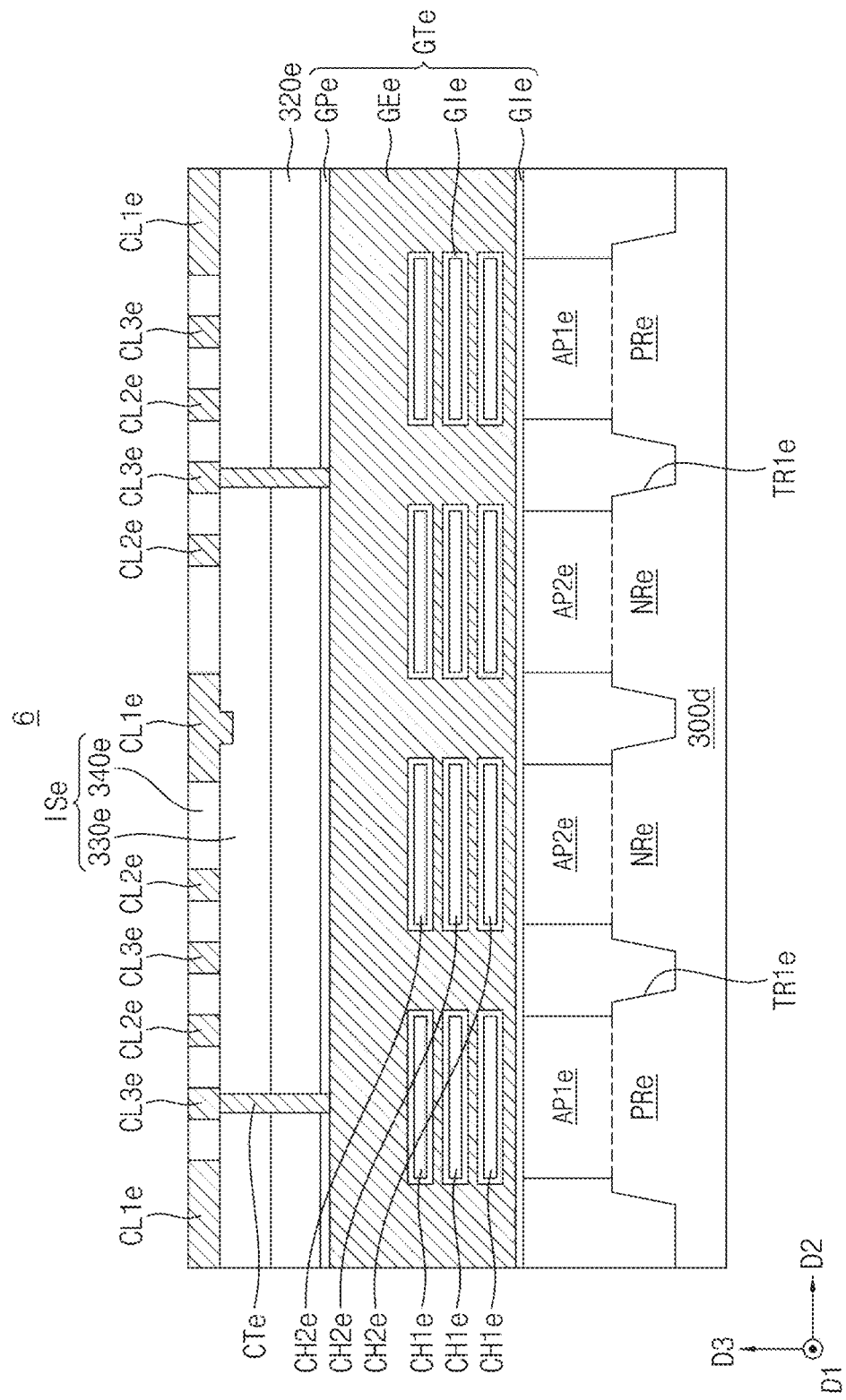
Figure 13C:
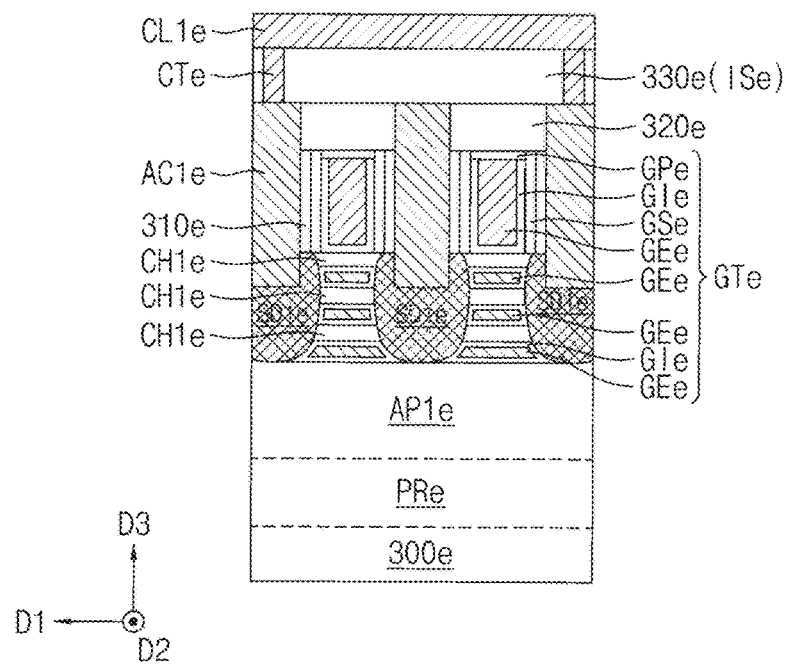
Figure 13D:
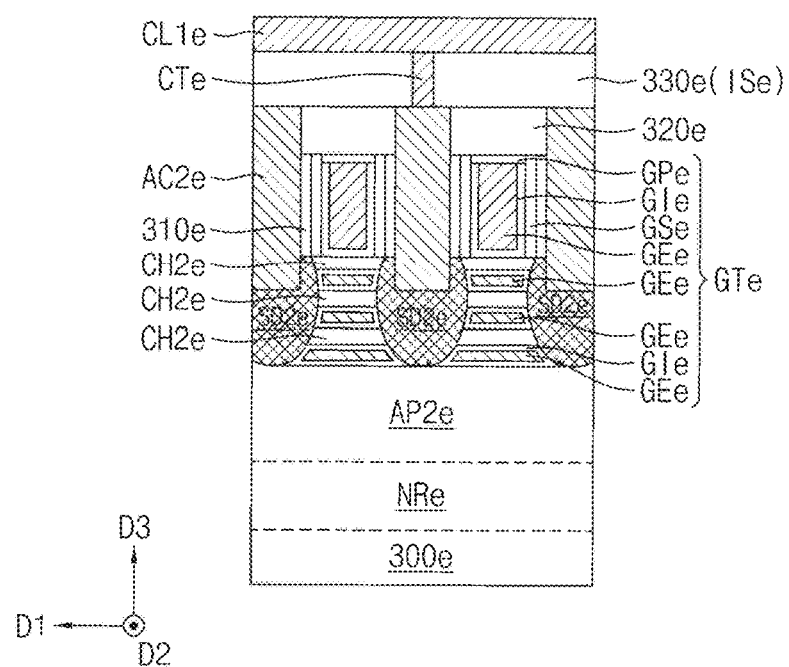

FIG. 12A is a plan view of a semiconductor device according to some example embodiments of the disclosure. FIG. 12B is a cross-sectional view taken along line A3-A3' in FIG. 12A. FIG. 12C is a cross-sectional view taken along line B3-B3' in FIG. 12A. FIG. 12D is a cross-sectional view taken along line C3-C3' in FIG. 12A. FIG. 12E is a cross-sectional view taken along line D3-D3' in FIG. 12A.

Referring to FIGS. 12A, 12B, 12C, 12D and 12E, a semiconductor device 5 may include a substrate 300*d*. The substrate 300*d* may include first active regions PRd and second active regions NRd. In some example embodiments, each first active region PRd may be a PMOSFET region, and each second active region NRd may be an NMOSFET region. The first and second active regions PRd and NRd may extend in a first direction D1. The first and second regions PRd and NRd may be a part of the substrate 300*d*.

The first active regions PRd and the second active regions NRd may be defined by first trenches TR1*d*. Each of the first active regions PRd and the second active regions NRd may be provided between two first trenches TR1*d* adjacent to each other. The first and second active regions PRd and NRd may be spaced apart from each other in a second direction D2.

The substrate 300*d* may include a plurality of first active patterns AP1*d* respectively provided on the first active regions PRd. The first active patterns AP1*d* may protrude from the first active regions PRd in a third direction D3, respectively. The first active patterns AP1*d* may be a part of the substrate 300*d*. The first active patterns AP1*d* may extend in the first direction D1.

The first active patterns AP1*d* may be defined by second trenches TR2*d*. Each second trench TR2*d* may be provided between two first active patterns AP1*d* adjacent to each other. The adjacent first active patterns AP1*d* may be spaced apart from each other in the second direction D2 under the condition that the second trench TR2*d* is interposed therebetween.

The substrate 300*d* may include a plurality of second active patterns AP2*d* respectively provided on the second active regions NRd. The second active patterns AP2*d* may protrude from the second active regions NRd in the third direction D3, respectively. The second active patterns AP2*d* may be a part of the substrate 300*d*. The second active patterns AP2*d* may extend in the first direction D1.

The second active patterns AP2*d* may be defined by third trenches TR3*d*. Each third trench TR3*d* may be provided between two second active patterns AP2*d* adjacent to each other. The adjacent second active patterns AP2*d* may be spaced apart from each other in the second direction D2 under the condition that the third trench TR3*d* is interposed therebetween.

An element isolation layer STd may be provided on the substrate 300*d*. The element isolation layer STd may include an insulating material. For example, the element isolation layer STd may include an oxide. The element isolation layer STd may fill the first to third trenches TR1*d*, TR2*d* and TR3*d*. The element isolation layer STd may cover the first and second active regions PRd and NRd. The first and second active patterns AP1*d* and AP2*d* may extend through the element isolation layer STd.

First source/drain patterns SD1*d* may be provided on the first active patterns AP1*d*. In some example embodiments, the first source/drain patterns SD1*d* may be P-type impurity regions. The first source/drain patterns SD1*d* may be spaced apart from one another in the first direction D1. A first channel CH1*d* may be provided between adjacent ones of the first source/drain patterns SD1*d* in the first direction D1. A portion of the first active pattern AP1*d* interposed between the adjacent first source/drain patterns SD1*d* may be defined as the first channel CH1*d*.

Second source/drain patterns SD2*d* may be provided on the second active patterns AP2*d*. In some example embodiments, the second source/drain patterns SD2*d* may be N-type impurity regions. The second source/drain patterns SD2*d* may be spaced apart from one another in the first direction D1. A second channel CH2*d* may be provided between adjacent ones of the second source/drain patterns SD2*d* in the first direction D1. A portion of the second active pattern AP2*d* interposed between the adjacent second source/drain patterns SD2*d* may be defined as the second channel CH2*d*.

The first and second source/drain patterns SD1*d* and SD2*d* may be epitaxial patterns formed through a selective epitaxial growth process. The first and second source/drain patterns SD1*d* and SD2*d* may include a semiconductor material.

Gate structures GTd may be provided on the first and second channels CH1*d* and CH2*d* of the first and second active patterns AP1*d* and AP2*d*. The gate structures GTd may extend in the second direction D2. The gate structures GTd may be spaced apart from one another in the first direction D1. Each gate structure GTd may cover side walls and top surfaces of the first and second channels CH1d and CH2d.

Each gate structure GTd may include a gate electrode GEd, a gate insulating layer GId, gate spacers GSd, and a gate capping layer GPd. The gate electrode GEd may extend in the second direction D2. The gate electrode GEd may include a conductive material. The gate spacers GSd may be provided at opposite sides of the gate electrode GEd, respectively. The gate spacers GSd may include an insulating material. The gate insulating layer GId may cover a side wall and a bottom surface of the gate electrode GEd. The gate electrode GEd may be spaced apart from the first channel CH1d or the second channel CH2d by the gate insulating layer GId. The gate electrode GEd may be spaced apart from the gate spacers GSd by the gate insulating layer GId. The gate capping layer GPd may cover a top surface of the gate electrode GEd. The gate capping layer GPd may include an insulating material.

In some example embodiments, a semiconductor device may include a negative capacitance (NC) FET using a negative capacitor. For example, a gate insulating layer may include a ferroelectric material layer having ferroelectric characteristics, and a paraelectric material layer having paraelectric characteristics.

The ferroelectric material layer may have a negative capacitance, whereas the paraelectric material layer may have a positive capacitance. For example, when two or more capacitors are connected in series, and the capacitance of each of the capacitors has a positive value, the total capacitance of the capacitors may be lower than the capacitance of each individual capacitor. On the other hand, when the capacitance of at least one of the two or more capacitors connected in series has a negative value, the total capacitance of the capacitors may have a positive value, and may be greater than an absolute value of each individual capacitor.

When a ferroelectric material layer having a negative capacitance and a paraelectric material layer having a positive capacitance are connected in series, the total capacitance value of the ferroelectric material layer and the paraelectric material layer connected to each other in series may increase. A transistor including a ferroelectric material layer may have sub-threshold swing (SS) of less than 60 mV/decade at normal temperature, using an increase in total capacitance value as described above.

The ferroelectric material layer may have ferroelectric characteristics. The ferroelectric material layer may include, for example, at least one of hafnium oxide, hafnium zirconium oxide, barium strontium titanium oxide, barium titanium oxide, or lead zirconium titanium oxide. Here, for example, hafnium zirconium oxide may be a material produced by doping hafnium oxide with zirconium (Zr). In another example, hafnium zirconium oxide may be a compound of hafnium (Hf), zirconium (Zr), and oxygen (0).

The ferroelectric material layer may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The kind of the dopant included in the ferroelectric material layer may be varied in accordance with which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic % (at %) of aluminum. Here, the ratio of the dopant may be the ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric characteristics. The paraelectric material layer may include, for example, at least one of silicon oxide or a metal oxide having a high dielectric constant. The metal oxide included in the paraelectric material layer may include, for example, at least one of hafnium oxide, zirconium oxide, or aluminum oxide, without being limited thereto.

The ferroelectric material layer and the paraelectric material layer may include the same material. The ferroelectric material layer has ferroelectric characteristics, but the paraelectric material layer may not have ferroelectric characteristics. For example, when both the ferroelectric material layer and the paraelectric material layer include hafnium oxide, the crystalline structure of the hafnium oxide included in the ferroelectric material layer may differ from the crystalline structure of the hafnium oxide included in the paraelectric material layer.

The ferroelectric material layer may have a thickness exhibiting ferroelectric characteristics. The thickness of the ferroelectric material layer may be, for example, 0.5 to 10 nm, without being limited thereto. The critical thickness exhibiting ferroelectric characteristics may be varied in accordance with different ferroelectric materials and, as such, the thickness of the ferroelectric material layer may be varied in accordance with the ferroelectric material thereof.

For example, the gate insulating layer may include one ferroelectric material layer. In another example, the gate insulating layer may include a plurality of ferroelectric material layers spaced apart from one another. The gate insulating layer may have a stacked layer structure in which a plurality of ferroelectric material layers and a plurality of paraelectric material layers are alternately stacked.

A first insulating layer 310d covering the first and second source/drain patterns SD1d and SD2d may be provided. The first insulating layer 310d may include an insulating material. A second insulating layer 320d covering the first insulating layer 310d and the gate structures GTd may be provided.

First active contacts AC1d and second active contacts AC2d extending through the first and second insulating layers 310d and 320d may be provided. The first active contacts AC1d may be connected to the first source/drain patterns SD1d, respectively. The second active contacts AC2d may be connected to the second source/drain patterns SD2d, respectively.

The first and second active contacts AC1d and AC2d may be provided between adjacent ones of the gate structures GTd in the first direction D1, respectively. The first and second active contacts AC1d and AC2d may be provided between adjacent ones of the gate electrodes GEd in the first direction D1, respectively.

An insulating structure ISd covering the second insulating layer 320d, the first active contacts AC1d and the second active contacts AC2d may be provided. The insulating structure ISd may include a third insulating layer 330d covering the second insulating layer 320d, and a fourth insulating layer 340d covering the third insulating layer 330d. The third insulating layer 340d and the four insulating layer 340d may include an insulating material.

First conductive lines CL1d, second conductive lines CL2d, and third conductive lines CL3d may be provided in the insulating structure ISd. The first to third conductive lines CL1d, CL2d and CL3d may extend in the first direction D1. At least one of the first conductive lines CL1d may include a base and a protrusion PTd. The first conductive lines CL1d may be power lines. The second and third conductive lines CL2d and CL3d may be signal lines. The levels of bottom surfaces of the second and third conductive lines CL2d and CL3d may be the same as the level of a bottom surface of the base in each of the first conductive lines CL1d.

Contacts CTd may be provided in the insulating structure ISd. The contacts CTd may electrically connect the first active contacts AC1d, the second active contacts AC2d and the gate electrodes GEd to the first to third conductive lines CL1d, CL2d and CL3d.

The first conductive line CL1d may be electrically connected to the first active contact AC1d via the contact CTd. The first conductive line CL1d may be electrically connected to the second active contact AC2d via the contact CTd. Each of the second and third conductive lines CL2d and CL3d may be electrically connected to the gate electrode GEd, the active contact AC1d or the second active contact AC2d via the contact CTd.

FIGS. 13A, 13B, 13C and 13D are cross-sectional views explaining a semiconductor device according to some example embodiments of the disclosure.

Referring to FIGS. 13A, 13B, 13C and 13D, a semiconductor device 6 may include a substrate 300e. The substrate 300e may include first active regions PRe and second active regions NRe. In some example embodiments, the first active regions PRe and the second active regions NRe may be defined by first trenches TR1e.

The substrate 300e may include first active patterns AP1e respectively provided on the first active regions Pre. The substrate 300e may include second active patterns AP2e respectively provided on the second active regions NRe. An element isolation layer STe may be provided on the substrate 300e. The first and second active patterns AP1e and AP2e may extend through the element isolation layer STe.

First source/drain patterns SD1e may be provided on the first active patterns AP1e. The first source/drain patterns SD1e on the first active patterns AP1e may be spaced apart from one another in a first direction D1. A plurality of first channels CH1e may be provided between adjacent ones of the first source/drain patterns SD1e in the first direction D1. The plurality of first channels CH1e may be provided between a corresponding pair of the first source/drain patterns SD1e that are adjacent to each other in the first direction D1 and may be spaced apart from one another in a third direction D3. Thus, the plurality of first channels CH1e may overlap one another in the third direction D3.

Second source/drain patterns SD2e may be provided on the second active patterns AP2e, respectively. The second source/drain patterns SD2e on the second active patterns AP2e may be spaced apart from one another in the first direction D1. A plurality of second channels CH2e may be provided between adjacent ones of the second source/drain patterns SD2e in the first direction D1. The plurality of second channels CH2e may be between a corresponding pair of the second source/drain patterns SD2e that are adjacent to each other in the first direction D1 and may be spaced apart from one another in the third direction D3. Thus, the plurality of second channels CH2e may overlap one another in the third direction D3.

Gate structures GTe each including a gate electrode GEe, a gate insulating layer GIe, gate spacers GSe, and a gate capping layer GPe may be provided. The gate electrode GEe may surround a plurality of first channels CH1e and a plurality of second channels CH2e. The gate electrode GEe may include a portion interposed between the first channels CH1e spaced apart from each other in the third direction D3, a portion interposed between the second channels CH2e spaced apart from each other in the third direction D3, a portion interposed between the first channel CH1e and the first active pattern AP1e, and a portion interposed between the second channel CH2e and the second active pattern AP2e. The gate insulating layer GTe may be interposed between the gate electrode GEe and each of the first channels CH1e, between the gate electrode GEe and each of the second channels CH2e, and between the gate electrode GEe and each of the first and second active patterns AP1e and AP2e.

A first insulating layer 310e covering the first and second source/drain patterns SD1e and SD2e may be provided. A second insulating layer 320e covering the first insulating layer 310e and the gate structures GTe may be provided.

First active contacts AC1e and second active contacts AC2e extending through the first and second insulating layers 310e and 320e may be provided. An insulating structure ISe covering the second insulating layer 320e, the first active contacts AC1e and the second active contacts AC2e may be provided. The insulating structure ISe may include a third insulating layer 330e covering the second insulating layer 320e, and a fourth insulating layer 340e covering the third insulating layer 330e.

First conductive lines CL1e, second conductive lines CL2e, and third conductive lines CL3e may be provided in the insulating structure ISe. Contacts CTe may be provided in the insulating structure ISe.

Figure 14A:
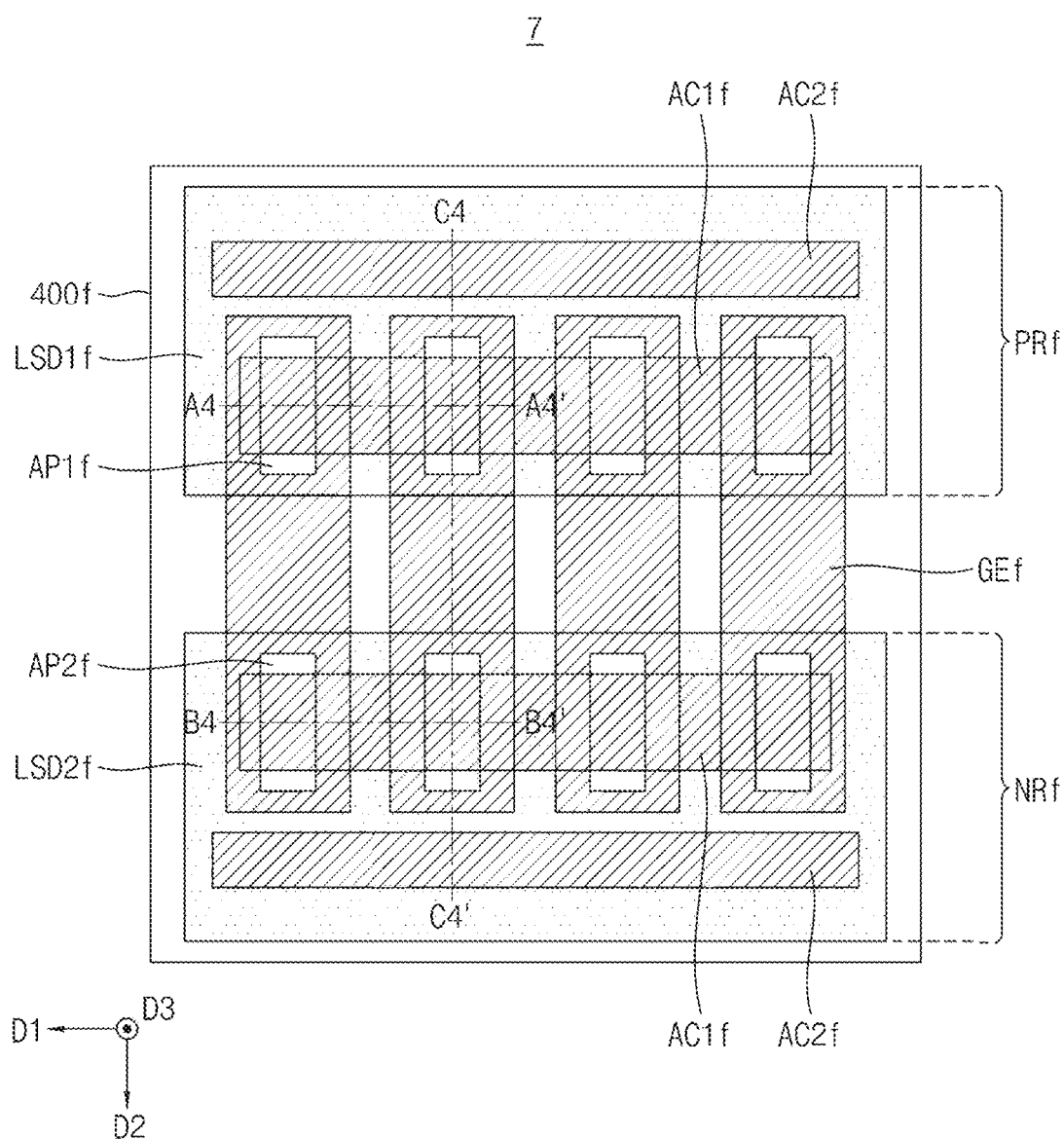
FIG. 14A is a plan view of a semiconductor device according to some example embodiments of the disclosure.
Figure 14B:
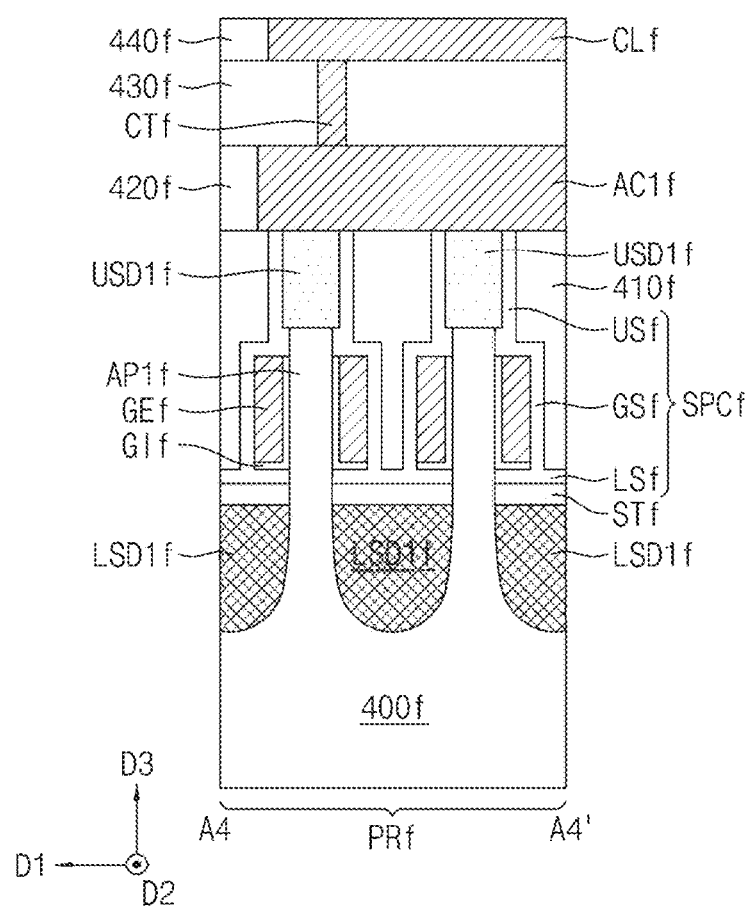
FIG. 14B is a cross-sectional view taken along line A4-A4' in FIG. 14A.
Figure 14C:
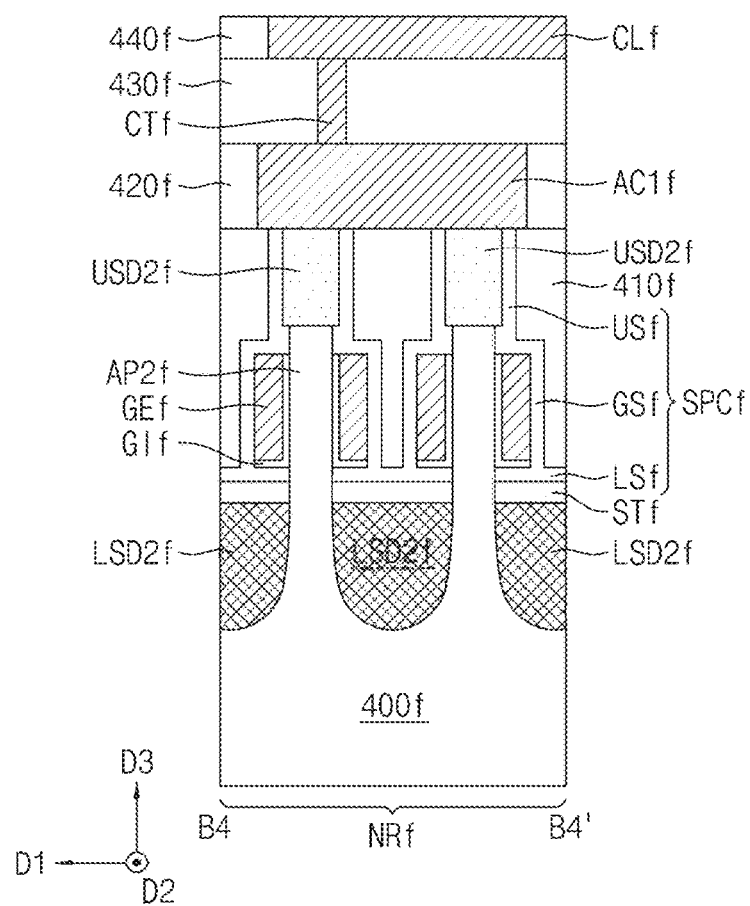
FIG. 14C is a cross-sectional view taken along line B4-B4' in FIG. 14A.
Figure 14D:
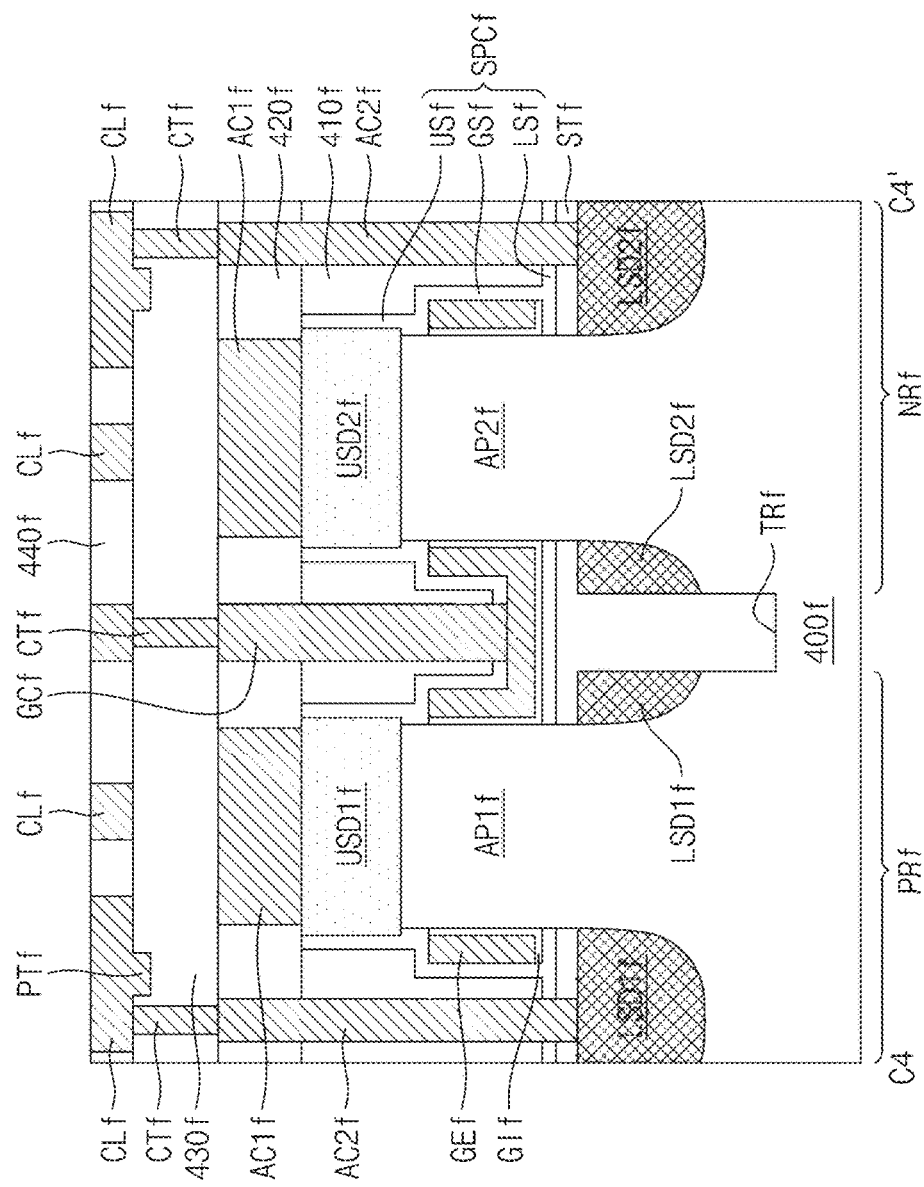
FIG. 14D is a cross-sectional view taken along line C4-C4' in FIG. 14A.

FIG. 14A is a plan view of a semiconductor device according to some example embodiments of the disclosure. FIG. 14B is a cross-sectional view taken along line A4-A4' in FIG. 14A. FIG. 14C is a cross-sectional view taken along line B4-B4' in FIG. 14A. FIG. 14D is a cross-sectional view taken along line C4-C4' in FIG. 14A.

Referring to FIGS. 14A, 14B, 14C and 14D, a logic element may be provided on a substrate 400f of a semiconductor device 7. The logic element may include vertical field effect transistors (vertical FETs), and wirings connecting the vertical transistors.

The logic element on the substrate 400f may include a first active region PRf and a second active region NRf. The first and second active regions PRf and NRf may be defined by a trench TRf formed at an upper portion of the substrate 400f. The first and second active regions PRf and NRf may be spaced apart from each other in a second direction D2.

A first lower source/drain pattern LSD1f may be provided on the first active region PRf. A second lower source/drain pattern LSD2f may be provided on the second active region NRf. When viewed in a plan view, the first lower source/drain pattern LSD1f may overlap the first active region PRf, and the second lower source/drain pattern LSD2f may overlap the second active region NRf. The first and second lower source/drain patterns LSD1f and LSD2f may be epitaxial patterns formed through a selective epitaxial growth process.

First active patterns AP1f may be provided on the first active region PRf, and second active patterns AP2f may be provided on the second active region NRf. Each of the first and second active patterns AP1f and AP2f may have the form of a vertically protruding fin. When viewed in a plan view, each of the first and second active patterns AP1f and AP2f may have the form of a bar extending in the second direction D2. The first active patterns AP1f may be arranged in a first direction D1, and the second active pattern AP2f may be arranged in the first direction D1.

First upper source/drain patterns USD1f may be provided on the first active patterns AP1f, respectively. Second upper source/drain patterns USD2f may be provided on the second active patterns AP2f, respectively.

An element isolation layer STf may be provided on the substrate 400f, to fill the trench TRf. The element isolation layer STf may cover top surfaces of the first and second lower source/drain patterns LSD1f and LSD2f. The first and second active patterns AP1f and AP2f may vertically protrude over the element isolation layer STf.

A plurality of gate electrodes GEf extending in parallel in the second direction D2 may be provided on the element isolation layer STf. The gate electrodes GEf may be arranged in the first direction D1. The gate electrode GEf may surround the first active pattern AP1f, and may surround the second active pattern AP2f.

A gate insulating layer GIf may be interposed between the gate electrode GEf and each of the first and second active patterns AP1f and AP2f. The gate insulating layer GIf may cover a bottom surface of the gate electrode GEf and an inner side wall of the gate electrode GEf.

First and second upper source/drain patterns USD1f and USD2f may be provided over the gate electrode GEf. A top surface of the gate electrode GEf may be lower than respective bottom surfaces of the first and second upper source/drain patterns USD1f and USD2f. Each of the first and second active patterns AP1f and AP2f may have a structure protruding vertically from the substrate 400f, to extend through the gate electrode GEf.

The semiconductor device 7 may include vertical transistors in which carriers migrate in a third direction D3. For example, when a voltage is applied to the gate electrode GEf, and a corresponding one of the transistors turns "on", carriers may migrate from the lower source/drain patterns LSD1f and LSD2f to the upper source/drain patterns USD1f and USD2f via the active patterns AP1f and AP2f. The gate electrode GEf may surround side walls of the active patterns AP1f and AP2f. The transistor of the semiconductor device may be a three-dimensional field effect transistor (for example, a VFET) having a gate all around structure. Because a gate surrounds a channel, the semiconductor device may have excellent electrical characteristics.

A spacer SPCf covering the gate electrodes GEf, the first and second active patterns AP1f and AP2f, and the first and second upper source/drain patterns USD1f and USD2f may be provided on the element isolation layer STf. The spacer SPCf may include a silicon nitride layer or a silicon oxynitride layer. The spacer SPCf may include a lower spacer LSf, an upper spacer USf, and a gate spacer GSf between the lower and upper spacers LSf and USf.

The lower spacer LSf may directly cover a top surface of the element isolation layer STf. The gate electrodes GEf may be spaced apart from the element isolation layer STf in the third direction D3 by the lower spacer LSf. The gate spacer GSf may cover the top surface and an outer side wall of each gate electrode GEf. The upper spacer USf may cover the first and second upper source/drain patterns USD1f and USD2f. The upper spacer USF may expose top surfaces of the first and second upper source/drain patterns USD1f and USD2f without covering the top surfaces of the first and second upper source/drain patterns USD1f and USD2f.

A first insulating layer 410f may be provided on the spacer SPCf. A top surface of the first insulating layer 410f may be substantially coplanar with the top surfaces of the first and second upper source/drain patterns USD1f and USD2f. Second to fourth insulating layers 420f, 430f and 440f may be sequentially stacked on the first insulating layer 410f. The second insulating layer 420f may cover the top surfaces of the first and second upper source/drain patterns USD1f and USD2f.

At least one first active contact AC1f connected to the first and second upper source/drain patterns USD1f and USD2f while extending through the second insulating layer 420f may be provided. At least one second active contact AC2f connected to the first and second lower source/drain patterns LSD1f and LSD2f while extending sequentially through the second insulating layer 420f, the first insulating layer 410f, the lower spacer LSf and the element isolation layer STf may be provided. A gate contact GCf connected to the gate electrode GEf while extending sequentially through the second insulating layer 420f, the first insulating layer 410f and the gate spacer GSf may be provided.

Contacts CTf may be provided in the third insulating layer 430f. Each contact CTf may be connected to the first active contact AC1f, the second active contact AC2f, or the gate contact GCf.

Conductive lines CLf may be provided in the fourth insulating layer 440f. The conductive lines CLf may be connected to the contacts CTf, respectively. At least one of the conductive lines CLf may include a protrusion PTf.

The semiconductor devices according to the above example embodiments of the disclosure may achieve enhancement in uniformity of a process for manufacturing a conductive line, thereby enhancing reliability of a semiconductor device including the manufactured conductive line.

While some example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. A method for manufacturing a semiconductor device, comprising:
    forming an insulating structure;
    forming a hard mask layer on the insulating structure;
    performing a first etching process to form a first opening at the hard mask layer;
    forming a first sacrificial pattern in the first opening;
    forming, on the hard mask layer, a first photoresist pattern comprising a second opening and a third opening, the second opening exposing a top surface of the first sacrificial pattern, the third opening exposing a top surface of the hard mask layer; and
    performing a second etching process using the first photoresist pattern as an etch mask.

2. The method according to claim 1, wherein the performing the second etching process comprises partially etching the first sacrificial pattern through the second opening, and etching the hard mask layer through the third opening, thereby forming a fourth opening.

3. The method according to claim 2, wherein the performing the second etching process further comprises completely removing the first sacrificial pattern from the first opening.

4. The method according to claim 1, wherein the second opening overlaps the first sacrificial pattern.

5. The method according to claim 1, wherein a bottom surface of the second opening is defined by the top surface of the first sacrificial pattern.

6. The method according to claim 1, wherein:
the performing a second etching process forms a fourth opening to be connected to the first opening; and
a side wall of the fourth opening connects a bottom surface of the fourth opening and a bottom surface of the first opening.

7. The method according to claim 1, wherein the first photoresist pattern exposes a first portion of the top surface of the first sacrificial pattern and covers a second portion of the top surface of the first sacrificial pattern.

8. A method for manufacturing a semiconductor device, comprising:
forming an insulating structure;
forming a hard mask layer on the insulating structure;
performing a first etching process to form a first opening and a second opening at the hard mask layer;
forming a first sacrificial pattern in the first opening, and forming a second sacrificial pattern in the second opening;
forming, on the hard mask layer, a first photoresist pattern comprising a third opening, the third opening exposing a top surface of the first sacrificial pattern, the first photoresist pattern covering the second sacrificial pattern; and
performing a second etching process using the first photoresist pattern as an etch mask.

9. The method according to claim 8, wherein:
the first photoresist pattern further comprises a fourth opening to expose a top surface of the hard mask layer; and
the performing the second etching process comprises,
etching the first sacrificial pattern through the third opening, and
etching the hard mask layer through the fourth opening.

10. The method according to claim 9, wherein a width of the third opening and a width of the fourth opening are substantially equal.

11. The method according to claim 8, wherein a maximum width of the third opening is smaller than a minimum width of the first sacrificial pattern.

12. The method according to claim 8, wherein a maximum width of the third opening is smaller than a minimum width of the first opening.

13. The method according to claim 8, wherein:
the first photoresist pattern comprises a plurality of third openings, the plurality of third openings including the third opening; and
the first sacrificial pattern overlaps corresponding ones of the plurality of third openings, respectively.

14. The method according to claim 8, further comprising:
forming a contact in the insulating structure; and
performing a third etching process using the hard mask layer as an etch mask,
wherein the performing a third etching process comprises exposing the contact.

15. A method for manufacturing a semiconductor device, comprising:
performing a first etching process to form first openings and second openings at a hard mask layer;
forming first sacrificial patterns in the first openings, and forming second sacrificial patterns in the second openings;
forming, on the hard mask layer, a first photoresist pattern comprising third openings and fourth openings, the third openings respectively exposing top surfaces of the first sacrificial patterns, the fourth openings respectively exposing a top surface of the hard mask layer, the first photoresist pattern covering the second sacrificial patterns; and
performing a second etching process using the first photoresist pattern as an etch mask,
wherein the performing a second etching process comprises,
etching the first sacrificial patterns through the third openings, and
etching the hard mask layer through the fourth openings.

16. The method according to claim 15, further comprising:
forming fifth openings using the hard mask layer as an etch mask; and
forming conductive lines in the fifth openings.

17. The method according to claim 15, wherein the second openings are disposed among the first openings.

18. The method according to claim 15, wherein each of the fourth openings is disposed between two second openings adjacent to each other from among the second openings.

19. The method according to claim 15, wherein each of the fourth openings is disposed between one of the first openings and one of the second openings that are adjacent to each other.

20. The method according to claim 15, wherein the third openings overlap corresponding ones of the first sacrificial patterns, respectively.

* * * * *